United States Patent
Okumura et al.

(10) Patent No.: US 9,443,817 B2
(45) Date of Patent: Sep. 13, 2016

(54) METHOD OF MANUFACTURING SEMICONDUCTOR DEVICE AND SEMICONDUCTOR DEVICE

(71) Applicant: Renesas Electronics Corporation, Kawasaki-shi (JP)

(72) Inventors: Ayaka Okumura, Kawasaki (JP); Katsuhiko Hotta, Kawasaki (JP); Yoshinori Kondo, Kawasaki (JP); Hiroaki Osaka, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/592,730

(22) Filed: Jan. 8, 2015

(65) Prior Publication Data

US 2015/0200158 A1 Jul. 16, 2015

(30) Foreign Application Priority Data

Jan. 15, 2014 (JP) .................. 2014-005373

(51) Int. Cl.
| | | |
|---|---|---|
| *H01L 23/00* | (2006.01) | |
| *H01L 21/66* | (2006.01) | |
| *H01L 23/522* | (2006.01) | |
| *H01L 21/02* | (2006.01) | |

(Continued)

(52) U.S. Cl.
CPC ............ *H01L 24/45* (2013.01); *H01L 22/14* (2013.01); *H01L 24/05* (2013.01); *H01L 24/11* (2013.01); *H01L 24/13* (2013.01); *H01L 24/43* (2013.01); *H01L 21/02178* (2013.01); *H01L 21/02244* (2013.01); *H01L 21/02252* (2013.01); *H01L 21/321* (2013.01); *H01L 21/76801* (2013.01);

(Continued)

(58) Field of Classification Search
CPC ........... H01L 23/528; H01L 21/02178; H01L 21/76877; H01L 24/11; H01L 21/02164; H01L 23/53214; H01L 21/02271; H01L 27/088; H01L 24/13; H01L 21/32133; H01L 21/0217; H01L 21/76802; H01L 24/45; H01L 24/43; H01L 23/5226; H01L 2224/13025; H01L 2224/13023; H01L 2224/4502

See application file for complete search history.

(56) References Cited

U.S. PATENT DOCUMENTS

| | | | | |
|---|---|---|---|---|
| 6,984,591 B1 * | 1/2006 | Buchanan | ............... | C23C 16/16 257/751 |
| 2008/0296730 A1 * | 12/2008 | Nakao | ................ | H01L 23/5223 257/532 |

(Continued)

FOREIGN PATENT DOCUMENTS

| | | |
|---|---|---|
| JP | 4-186838 A | 7/1992 |
| JP | 2002-75996 A | 3/2002 |

*Primary Examiner* — Yu Chen
*Assistant Examiner* — Nilufa Rahim
(74) *Attorney, Agent, or Firm* — McGinn IP Law Group, PLLC

(57) ABSTRACT

Characteristics of a semiconductor device are improved. An opening that exposes a pad region of a top-layer wiring containing aluminum is formed in a protection film over the wiring, and aluminum nitride is formed on a surface of the exposed wiring. Additionally, a silicon nitride film is formed on a back surface of a semiconductor substrate having the wiring. As described above, foreign substances generated over the pad region due to the silicon nitride film on the back surface of the semiconductor substrate can be prevented by providing an aluminum nitride film over the pad region. Particularly, even in a case of requiring time before an inspection step and a bonding step, after a formation step of the pad region, formation reaction of the foreign substances can be prevented in the pad region, and the characteristics of the semiconductor device can be improved.

16 Claims, 28 Drawing Sheets

(51) Int. Cl.
  *H01L 23/532* (2006.01)
  *H01L 27/092* (2006.01)
  *H01L 21/321* (2006.01)
  *H01L 21/768* (2006.01)

(52) U.S. Cl.
  CPC .... *H01L 21/76834* (2013.01); *H01L 21/76838* (2013.01); *H01L 23/5226* (2013.01); *H01L 23/53223* (2013.01); *H01L 27/092* (2013.01); *H01L 2224/13023* (2013.01); *H01L 2224/13025* (2013.01); *H01L 2224/43* (2013.01); *H01L 2224/4502* (2013.01); *H01L 2224/45144* (2013.01)

(56) References Cited

U.S. PATENT DOCUMENTS

| | | | |
|---|---|---|---|
| 2009/0078979 A1* | 3/2009 | Kumura et al. | 257/295 |
| 2009/0093115 A1* | 4/2009 | Park | 438/653 |
| 2010/0233863 A1* | 9/2010 | Kawamura et al. | 438/287 |
| 2010/0327449 A1* | 12/2010 | Furusawa et al. | 257/751 |
| 2012/0009781 A1* | 1/2012 | Choi | H01L 21/76814 438/653 |
| 2013/0237056 A1* | 9/2013 | Liu-Norrod | C23C 18/1605 438/675 |

* cited by examiner

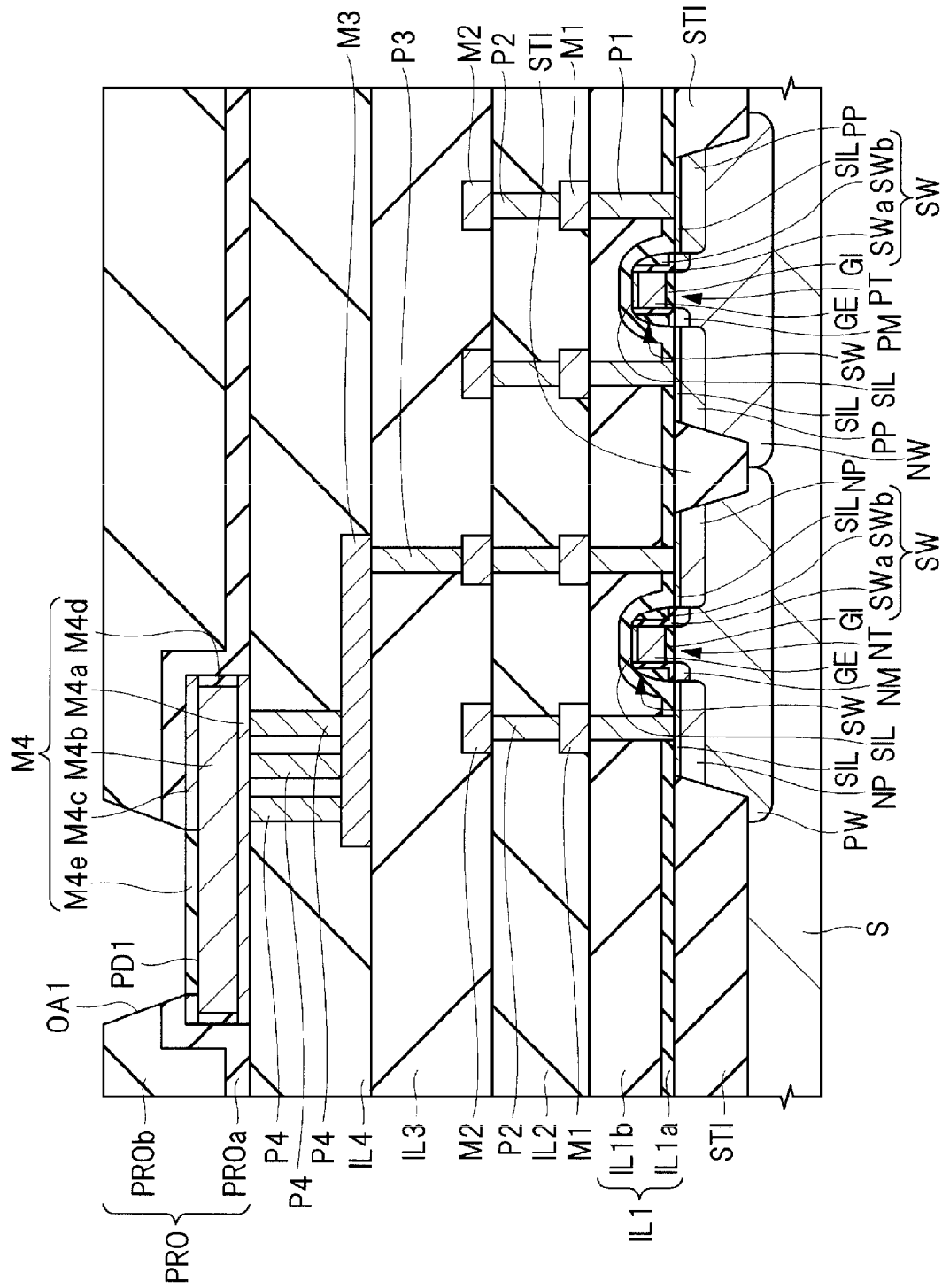

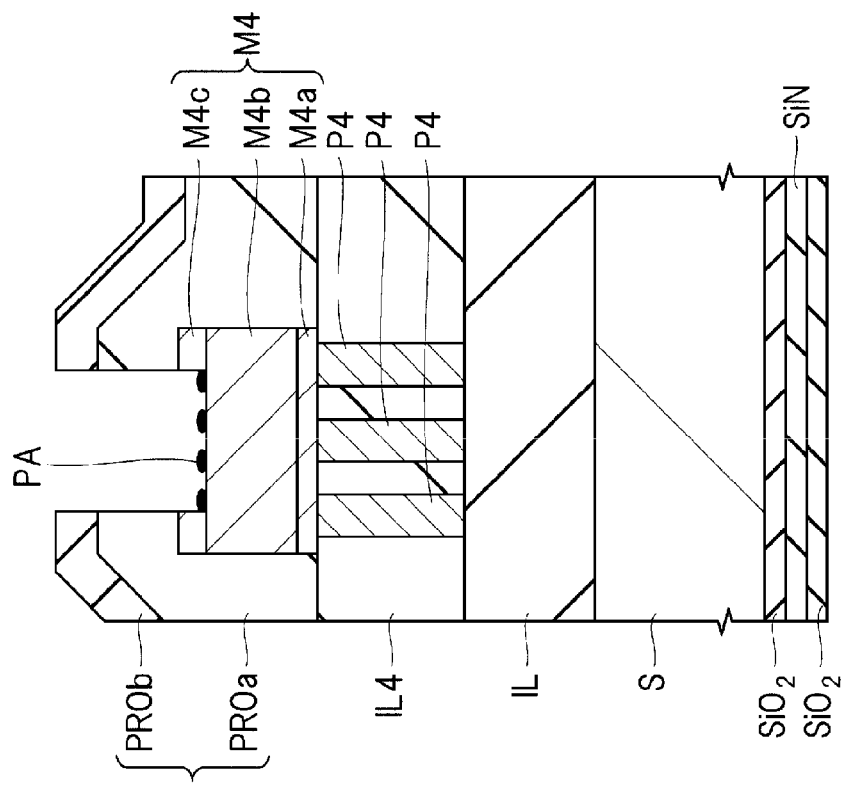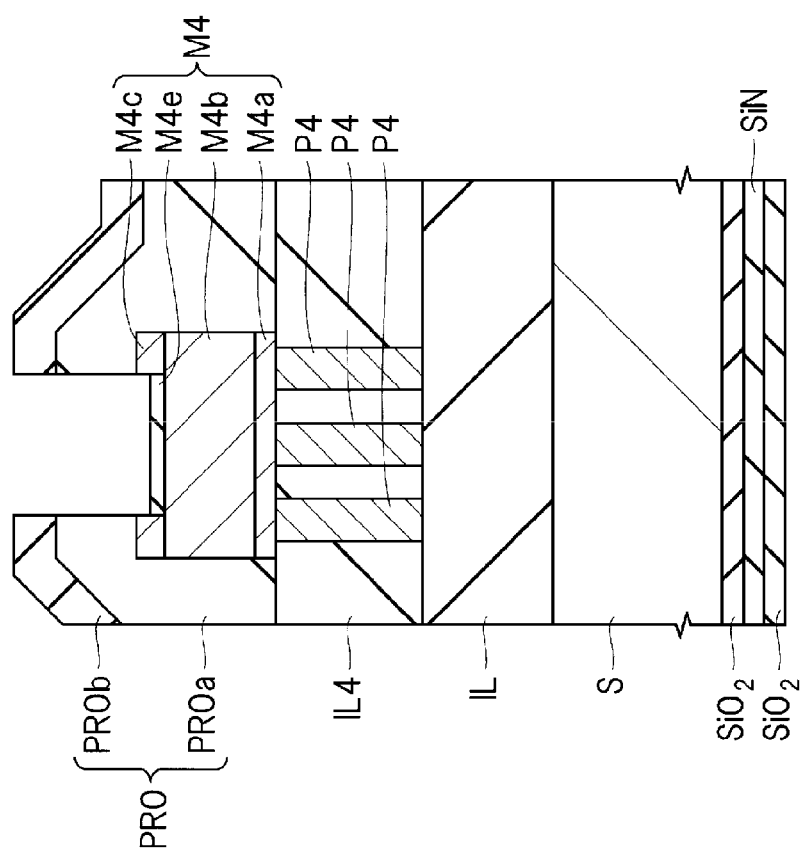

METHOD OF MANUFACTURING SEMICONDUCTOR DEVICE AND SEMICONDUCTOR DEVICE

CROSS-REFERENCE TO RELATED APPLICATION

The disclosure of Japanese Patent Application No. 2014-005373 filed on Jan. 15, 2014 including the specification, drawings and abstract is incorporated herein by reference in its entirety.

BACKGROUND

1. Field of the Invention

The present invention relates to a method of manufacturing a semiconductor device and the semiconductor device and, for example, can be suitably utilized for a method of manufacturing a semiconductor device having a pad region, and the semiconductor device having the pad region.

2. Description of the Related Art

A semiconductor device having semiconductor elements, such as an MISFET, and wirings is formed by stacking over a semiconductor substrate insulating films, such as a silicon oxide film and a silicon nitride film, a semiconductor film, and a conductive film. Such semiconductor element is electrically coupled to a pad region via plural layers of wirings. This pad region is coupled to an external terminal via a wire, a bump electrode, or the like.

For example, in Japanese Patent Laid-Open No. 2002-75996, there is disclosed a technology of preventing contact failure of a pad by etching a wiring layer surface using an ammonium fluoride containing liquid after a step of etching a passivation film.

In addition, in Japanese Patent Laid-Open No. 1992-186838, there is disclosed a technology of forming Al nitride on a surface of an Al wiring after removing $Al_2O_3$, which is a contamination layer of a surface of the wiring, using $BCl_3$ gas.

The present inventor is engaged in research and development of a semiconductor device having a pad region, and has earnestly examined characteristic improvement thereof. In a process of the research and development, it turned out that there was a room for further improvement of the semiconductor device having the pad region.

The other problems and the new feature will become clear from the description of the present specification and the accompanying drawings.

SUMMARY

The following explains briefly the outline of a configuration shown in a typical embodiment disclosed in the present application.

A method of manufacturing a semiconductor device shown in typical embodiments disclosed in the present application includes the steps of: forming an opening in an insulating film over a wiring containing aluminum, the opening exposing a part of a surface of the wiring; and forming aluminum nitride on the surface of the exposed wiring.

The semiconductor device shown in the typical embodiments disclosed in the present application includes: the insulating film that is formed over the wiring containing aluminum and has the opening; and the aluminum nitride formed over the wiring at a bottom surface of the opening.

According to the method of manufacturing the semiconductor device shown in the typical embodiments disclosed in the present application, a semiconductor device with good characteristics can be manufactured.

In addition, according to the semiconductor device shown in the typical embodiments disclosed in the present application, characteristics thereof can be improved.

BRIEF DESCRIPTION OF THE DRAWINGS

FIG. 1 is a cross-sectional diagram showing a configuration of a semiconductor device of a first embodiment;

FIGS. 2A and 2B are cross-sectional diagrams schematically showing appearances of pad regions and back surfaces of semiconductor substrates of the semiconductor devices of the first embodiment and a comparative example, respectively;

DETAILED DESCRIPTION

Figure 3:
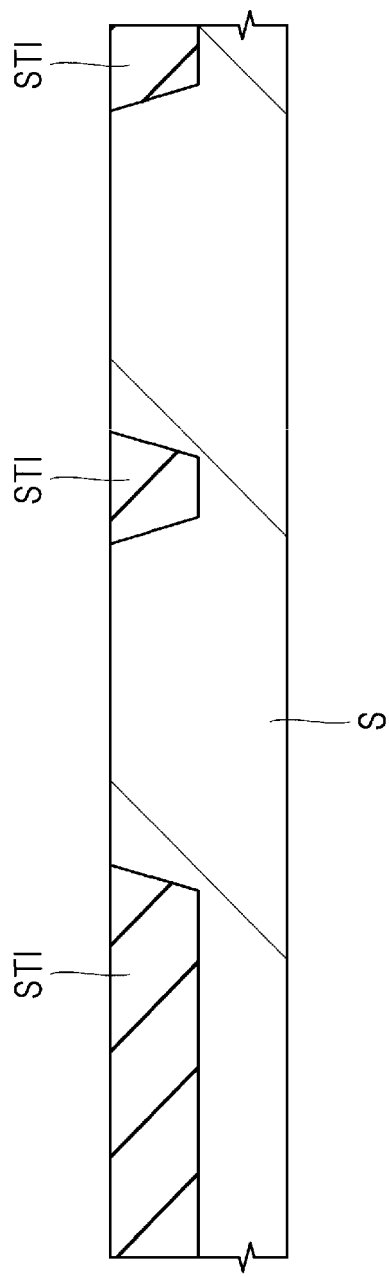
FIG. 3 is a cross-sectional diagram showing a manufacturing step of the semiconductor device of the first embodiment.

The following embodiments will be explained, divided into plural sections or embodiments, if necessary for convenience. Except for the case where it shows clearly in particular, they are not mutually unrelated and one has relationships such as a modification, an application, detailed explanation, and supplementary explanation of some or entire of another. In addition, in the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the number, etc. (including the number, the numeric value, the amount, the range, etc.) described above.

Hereinafter, embodiments will be explained in detail based on drawings. It is to be noted that in all the drawings for explaining the embodiments, the same or a related symbol is attached to a member having the same function, and that the repeated explanation thereof is omitted. In addition, when a plurality of similar members (portions) is present, a mark may be added to a symbol of a general term to thereby indicate an individual or a particular portion in some cases. In addition, in the following embodiments, explanation of the same or a similar portion is not repeated as a principle, except for the case particularly needed.

In addition, in the drawings used in the embodiments, hatching may be omitted in order to make the drawings easy to see, even though they are cross-sectional diagrams.

In addition, in the cross-sectional diagrams, a size of each portion does not correspond to an actual device, and a particular portion may be represented relatively large in some cases in order to make the drawings intelligible.

(First Embodiment)

Hereinafter, a structure of a semiconductor device of the present embodiment will be explained with reference to the drawings.

[Structure Explanation]

FIG. 1 is a cross-sectional diagram showing a configuration of the semiconductor device of the present embodiment. The semiconductor device of the present embodiment has an n-channel type MISFET (NT) and a p-channel type MISFET (PT).

The n-channel type MISFET (NT) has: a gate electrode GE arranged over a substrate S (a p-type well PW) via a gate insulating film GI; and source/drain regions arranged in the semiconductor substrate S (p-type well PW) on both sides of the gate electrode GE. A side wall insulating film SW including an insulating film is formed on side wall portions of the gate electrode GE. As the insulating film, a stacked film of a silicon oxide film SWa and a silicon nitride film SWb is used. In addition, the source/drain regions each have an LDD structure and include an $n^+$ type semiconductor region NP and an $n^-$ type semiconductor region NM. The $n^-$ type semiconductor region NM is formed in a self-aligned manner with respect to the side wall of the gate electrode GE. In addition, the $n^+$ type semiconductor region NP is formed in a self-aligned manner with respect to a side surface of the side wall insulating film SW, and has a deeper junction depth and a higher impurity concentration than the $n^-$ type semiconductor region NM. A gate length of the n-channel type MISFET (NT) is fine, for example, not more than 150 nm.

The p-channel type MISFET (PT) has: a gate electrode GE arranged over the semiconductor substrate S (an n-type well NW) via a gate insulating film GI; and source/drain regions arranged in the semiconductor substrate S (n-type well NW) on both sides of the gate electrode GE. A side wall insulating film SW including an insulating film is formed on side wall portions of the gate electrode GE. As the insulating film, a stacked film of a silicon oxide film SWa and a silicon nitride film SWb is used. In addition, the source/drain regions each have an LDD structure and include a $P^+$ type semiconductor region PP and a $p^-$ type semiconductor region PM. The $p^-$ type semiconductor region PM is formed in a self-aligned manner with respect to the side wall of the gate electrode GE. In addition, the $p^+$ type semiconductor region PP is formed in a self-aligned manner with respect to a side surface of the side wall insulating film SW, and has a deeper junction depth and a higher impurity concentration than the $p^-$ type semiconductor region PM. A gate length of the p-channel type MISFET (PT) is fine, for example, not more than 150 nm.

In addition, an interlayer insulating film IL1 is formed over the MISFETs (NT, PT), and wirings M1 are formed over the interlayer insulating film IL1. The source/drain regions of the MISFETs (NT, PT) and the wirings M1 are coupled to each other via plugs P1. These plugs P1 are formed in the interlayer insulating film IL1. The interlayer insulating film IL1, for example, includes a stacked film of a silicon nitride film IL1a located at a lower layer and a silicon oxide film IL1b located over the silicon nitride film IL1a.

In addition, an interlayer insulating film IL2 is formed over the wirings M1, and wirings M2 are formed over the interlayer insulating film IL2. These wirings M1 and M2 are coupled to each other via plugs P2 formed in the interlayer insulating film IL2. In addition, an interlayer insulating film IL3 is formed over the wirings M2, and a wiring M3 is formed over the interlayer insulating film IL3. These wirings M2 and M3 are coupled to each other via a plug P3 formed in the interlayer insulating film IL3. In addition, an interlayer insulating film IL4 is formed over the wiring M3, and a wiring M4 is formed over the interlayer insulating film IL4. These wirings M3 and M4 are coupled to each other via plugs P4 formed in the interlayer insulating film IL4.

A protection film PRO is formed over the wiring M4. An opening OA1 is provided in the protection film PRO, and a part of the wiring M4 is exposed from a bottom of the opening OA1. The exposed portion of the wiring M4 is called a pad region PD1. The wiring M4 is the wiring containing aluminum. In other words, the wiring M4 has an aluminum film. The aluminum film described here is not limited to a pure aluminum film, and is a conductive material film (however, the conductive material film exhibiting metallic conduction) containing aluminum as a principal component. Consequently, for example, a compound film or an alloy film of Al (aluminum) Si (silicon), and the like are also included. In addition, a composition ratio of Al (aluminum) in the aluminum film is desirably larger than 50 atom % (i.e., the aluminum film is Al-rich).

In the semiconductor device of the present embodiment, the wiring M4 is the top-layer wiring, desired wire connection of a semiconductor element (for example, the above-described MISFET) is made by the wirings (M1 to M4), and desired operation can be performed. Consequently, utilizing the pad region PD1, which is the exposed portion of the wiring (top-layer wiring) M4, can be performed a test (a test step) of whether or not the semiconductor device performs the desired operation.

In addition, as will be mentioned later, a projection electrode (a bump electrode) BP including a conductive member is formed over the pad region PD1. In addition, a bonding wire including a conductive member may be connected to over the pad region PD1 (refer to FIG. 26).

Here, in the present embodiment, an aluminum nitride film M4e is formed on the pad region PD1 (an exposed surface) of the wiring (top-layer wiring) M4 containing aluminum, and thereby corrosion of the wiring M4 is prevented. The corrosion prevention will be explained in detail hereinafter.

FIGS. 2A and 2B are diagrams schematically showing appearances of pad regions and back surfaces of semiconductor substrates of semiconductor devices of the present embodiment and a comparative example, respectively. FIG. 2A shows a case of the semiconductor device of the present embodiment, and FIG. 2B shows a case of the semiconductor device of the comparative example.

As shown in FIG. 2B, the wiring M4 over the plugs P4 has: a titanium/titanium nitride film M4a; an aluminum film M4b; and a titanium film M4c. The titanium/titanium nitride film M4a is a stacked film of a titanium film and a titanium nitride film formed thereover. The protection film PRO is formed over the wiring M4, and a main surface of the aluminum film M4b is exposed from a bottom of the opening OA1 (pad region PD1) in the protection film PRO. In other words, the protection film PRO and the titanium film M4c over the pad region PD1 over the wiring M4 are removed, and the aluminum film M4b is exposed. In the comparative example, foreign substances PA have been generated over the exposed portion of the aluminum film M4b.

Here, a silicon nitride film (SiN) and a silicon oxide film (SiO$_2$) are formed on the back surface of the semiconductor substrate S. It is to be noted that in FIG. 2B, omitted is description of the wirings, the plugs, and the MISFETs (NT, PT) in the lower layers than the plugs P4, which are formed in the interlayer insulating film IL.

As shown in FIG. 2A, in the present embodiment, the wiring M4 over the plugs P4 has: the titanium/titanium nitride film M4a; the aluminum film M4b; and the titanium film M4c. The protection film PRO is formed over the wiring M4, and the main surface of the aluminum film M4b is exposed from the bottom of the opening OA1 (pad region PD1) in the protection film PRO. In other words, the protection film PRO and the titanium film M4c over the pad region PD1 over the wiring M4 are removed, and the aluminum film M4b is exposed. Here, the aluminum nitride film M4e is formed over the aluminum film M4b. Also here, a silicon nitride film (SiN) and a silicon oxide film (SiO$_2$) are formed on the back surface of the semiconductor substrate S. These insulating films are, as will be mentioned later, formed by using a batch-type film formation apparatus in a manufacturing step of the semiconductor device. It is to be noted that in FIG. 2A, omitted is description of the wirings, the plugs, and the MISFETs (NT, PT) in the lower layers than the plugs P4, which are formed in the interlayer insulating film IL.

According to examination of the present inventors, when the aluminum film M4b is exposed from the pad region PD1 as in the semiconductor device of the comparative example, the aluminum film M4b exposed from the pad region PD1 corrodes. More specifically, undesired reactants (the foreign substances PA) are generated on a surface of the aluminum film M4b exposed from the pad region PD1 (refer to FIG. 2B).

Additionally, it turned out that such reactants were generated more in the semiconductor device in which a film had been formed on the back surface of the semiconductor substrate S than in the semiconductor device in which the film had not been formed on the back surface of the semiconductor substrate S. Furthermore, it turned out that a generation amount of $NH_4^+$ was large in the semiconductor device in which the film had been formed on the back surface of the semiconductor substrate S as compared with the semiconductor device in which the film had not been formed on the back surface of the semiconductor substrate S.

As a result of these, it is considered that the silicon nitride film formed on the back surface of the semiconductor substrate is concerned with the undesired reactants (foreign substances PA) formed on the surface of the aluminum film M4b.

Namely, it turned out that the generation amount of $NH_4^+$ increased due to the silicon nitride film (SiN) when the silicon nitride film (SiN) on the back surface of the semiconductor substrate S had been formed. $Al(OH)_3$ deposits as foreign substances due to reaction of the $NH_4^+$ and Al (an Al ion).

Formation reaction of $Al(OH)_3$ is shown below.

$2Al = 2Al_3^+ + 6e^-$   (Chemical formula 1)

$6NH_3 + 6H_2O = 6NH_4^+ + 6OH^-$   (Chemical formula 2)

$2Al_3^+ + 6HO^- = 2Al(OH)_3 \downarrow$   (Chemical formula 3)

$6NH_4^+ + 6e^- = 6NH_3 + 3H_2 \uparrow$   (Chemical formula 4)

When such foreign substances ($Al(OH)_3$) are generated, the conductive members (the bump electrode, the bonding wire) cannot be accurately formed over the pad region PD1, and the semiconductor device becomes defective.

Furthermore, according to the examination of the present inventors, it was proved that the silicon nitride film formed on the back surface of the semiconductor substrate, even in a case where it was covered with the silicon oxide film or the like, passes through the silicon oxide film to generate $NH_4^+$.

Consequently, it was proved that once the silicon nitride film was formed on the back surface of the semiconductor substrate in the manufacturing step of the semiconductor device, the foreign substances ($Al(OH)_3$) were generated due to the silicon nitride film.

In addition, after a formation step of the pad region PD1, subsequent steps, such as an inspection step and a bonding step, are standing by. There is a case of requiring time before the inspection step and the bonding step in the manufacturing steps of the semiconductor device. For example, the semiconductor device may be stored within a FOUP (also called a substrate storage container or a substrate accommodation container) for not less than a week. In a case where a storage period is long as described above, the above-described formation reaction of $Al(OH)_3$ proceeds. In addition, the inspection step and the bonding step may be performed at a location different from a previous manufacturing line, and in that case, a storage period including a transport step of the FOUP may become long. In this case as well, the above-described formation reaction of $Al(OH)_3$ proceeds.

In contrast with this, according to the present embodiment, since the aluminum nitride film M4e is provided over the pad region PD1, the formation reaction of the foreign substances can be prevented in the pad region PD1. Particularly, even in the case of requiring time before the inspection step and the bonding step after the formation step of the pad region PD1, the formation reaction of the foreign substances can be prevented in the pad region PD1.

Furthermore, since the aluminum nitride film M4e over the pad region PD1 is a thin film (not more than 10 nm), it is easily broken at the time of a pressure bonding step of the conductive members (the bump electrode, the bonding wire) over the pad region PD1, and electrical conduction of the conductive members and the pad region PD1 (wiring M4) can be achieved.

[Manufacturing Method Explanation]

Next, a method of manufacturing the semiconductor device of the present embodiment will be explained with reference to FIGS. 3 to 26. FIGS. 3 to 26 (except for FIGS. 5 and 6) are cross-sectional diagrams showing manufacturing steps of the semiconductor device of the present embodiment.

As shown in FIG. 3, as the semiconductor substrate (a wafer) S, for example, prepared is a silicon substrate including p-type single crystal silicon having a specific resistance of approximately 1 to 10 Ωcm. It is to be noted that a semiconductor substrate S other than the silicon substrate may be used.

Next, an element isolation region STI is formed on a main surface of the semiconductor substrate S. For example, an element isolation groove is formed in the semiconductor substrate S, an insulating film, such as a silicon oxide film, is buried inside the element isolation groove, and thereby the element isolation region STI is formed. It is to be noted that the element isolation region may be formed using a LOCOS (Local Oxidation of Silicon) method.

Next, the p-type well PW is formed in a formation region of the n-channel type MISFET (NT) of the semiconductor substrate S, and the n-type well NW is formed in a formation region of the p-channel type MISFET (PT) thereof.

Figure 4:
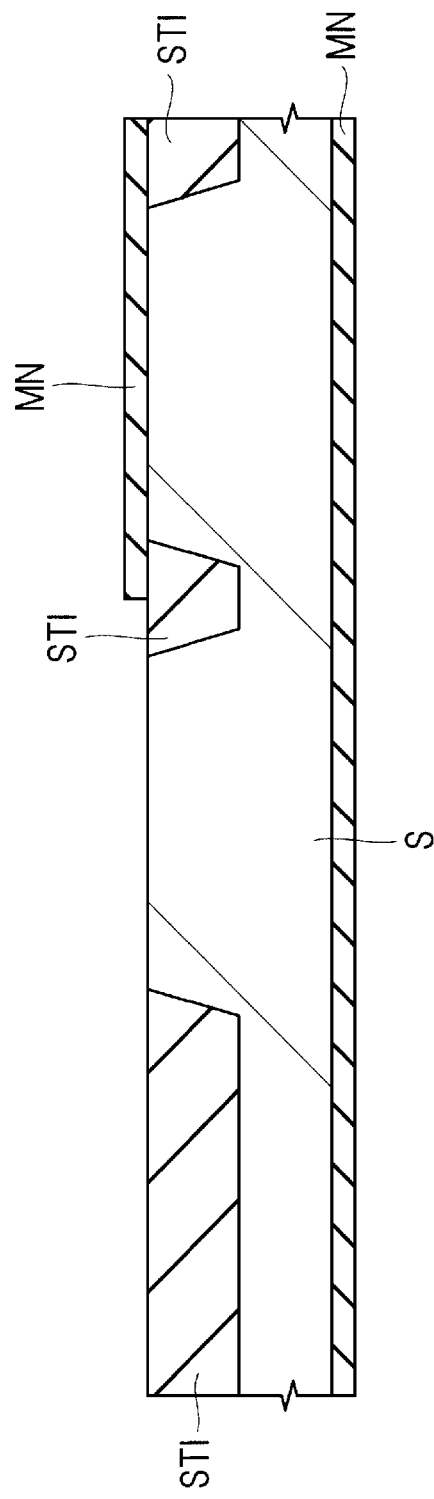
FIG. 4 is a cross-sectional diagram showing a manufacturing step of the semiconductor device of the first embodiment, and is the cross-sectional diagram showing the manufacturing step of the semiconductor device subsequent to FIG. 3.
Figure 7:
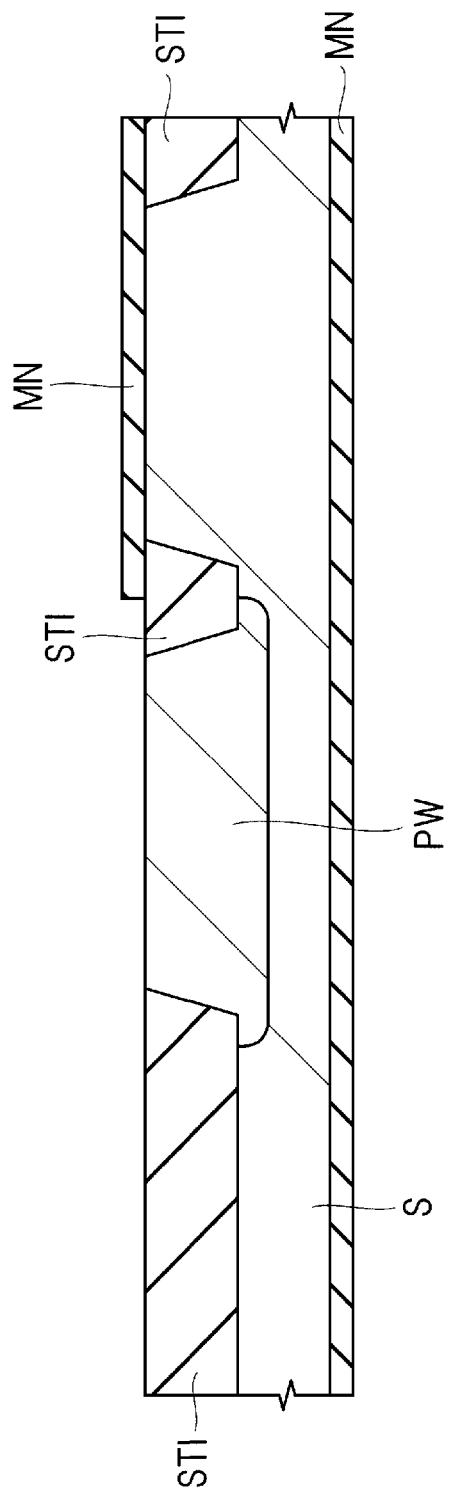
FIG. 7 is a cross-sectional diagram showing a manufacturing step of the semiconductor device of the first embodiment, and is the cross-sectional diagram showing the manufacturing step of the semiconductor device subsequent to FIG. 4.

For example, as shown in FIG. 4, the formation region of the p-channel type MISFET (PT) is covered with a mask film MN, a p-type impurity (such as boron (B)) is ion-implanted, and thereby the p-type well PW is formed (FIG. 7). The mask film MN, for example, includes a silicon oxide film, and can be formed by a CVD (Chemical Vapor Deposition) method. After the silicon oxide film is formed over a whole surface of the semiconductor substrate S as the mask film MN, patterning is performed using a photolithography technology and an etching technology, and thereby the mask film MN other than the formation region of the p-channel type MISFET (PT) is removed.

Figure 5:
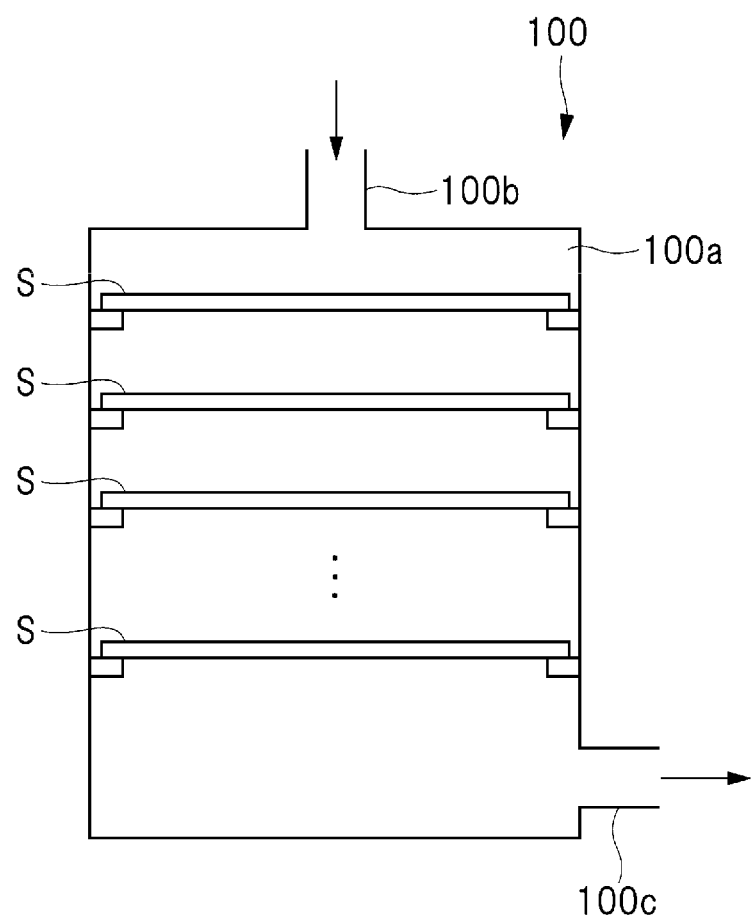
FIG. 5 is a schematic cross-sectional diagram of a CVD apparatus used in the first embodiment.

Here, it is possible to simultaneously form the mask films MN (silicon oxide films) with respect to the plurality of semiconductor substrates S. FIG. 5 is a schematic cross-sectional diagram of a CVD apparatus used in the present embodiment. In a CVD apparatus 100 shown in FIG. 5, the plurality of semiconductor substrates (wafers) S is stored inside a chamber (a treatment chamber, a furnace) 100a, they are exposed to source gas introduced from a gas introduction hole 100b, and the mask films MN (silicon oxide films) are formed over the whole surfaces of the semiconductor substrates S. At this time, since outer peripheral portions of the back surfaces of the semiconductor substrates S are supported (held) by support portions, and most of the back surfaces are exposed from the support portions, the mask films MN (silicon oxide films) are formed not only on front surface sides (upper sides in FIG. 5) of the semiconductor substrates S but on back surface sides (lower sides in FIG. 5) thereof (refer to FIG. 4). An apparatus that simultaneously treats the plurality of semiconductor substrates S as described above may be called a batch-type apparatus.

Figure 6:
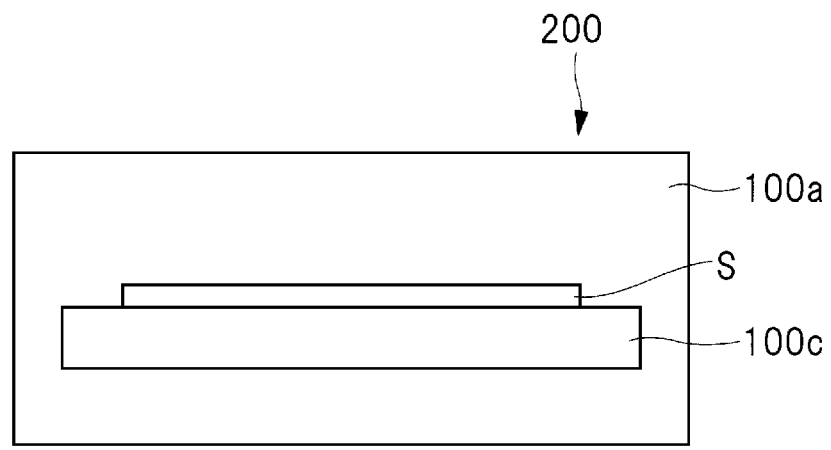
FIG. 6 is a schematic cross-sectional diagram of the apparatus used in the first embodiment.

In contrast with this, an apparatus shown in FIG. 6 is the apparatus that treats the semiconductor substrate S one by one. FIG. 6 is a schematic cross-sectional diagram of the apparatus used in the present embodiment. Such apparatus may be called a single-wafer type apparatus. For example, when a film is formed by such a single-wafer type CVD apparatus, the semiconductor substrate (wafer) S is mounted at a stage (a substrate mounting base) 100c in the chamber (treatment chamber) 100a, and the film is formed over the whole surface of the semiconductor substrate S by source gas introduced from a gas introduction hole (not shown). In a case of treatment using such single-wafer type CVD apparatus, since the back surface of the semiconductor substrate S is in contact with the stage 100c, the film is not formed on the back surface side of the semiconductor substrate S. In addition, the "single-wafer type" apparatus shown in FIG. 6 is used not only for a film formation apparatus, such as the CVD apparatus, but for a treatment apparatus, such as a dry etching apparatus.

Consequently, as mentioned above, when the mask film MN (silicon oxide film) is formed by the batch-type apparatus, the mask film MN is formed also on the back surface side of the semiconductor substrate S (refer to FIG. 4). Additionally, when etching of the mask film MN is performed by a single-wafer type etching apparatus, the mask film MN on the back surface side of the semiconductor substrate S becomes a state of not being removed but remaining (refer to FIG. 4). It is to be noted that when not clearly specified in an after-mentioned treatment step, treatment shall be performed by the single-wafer type apparatus.

Figure 8:
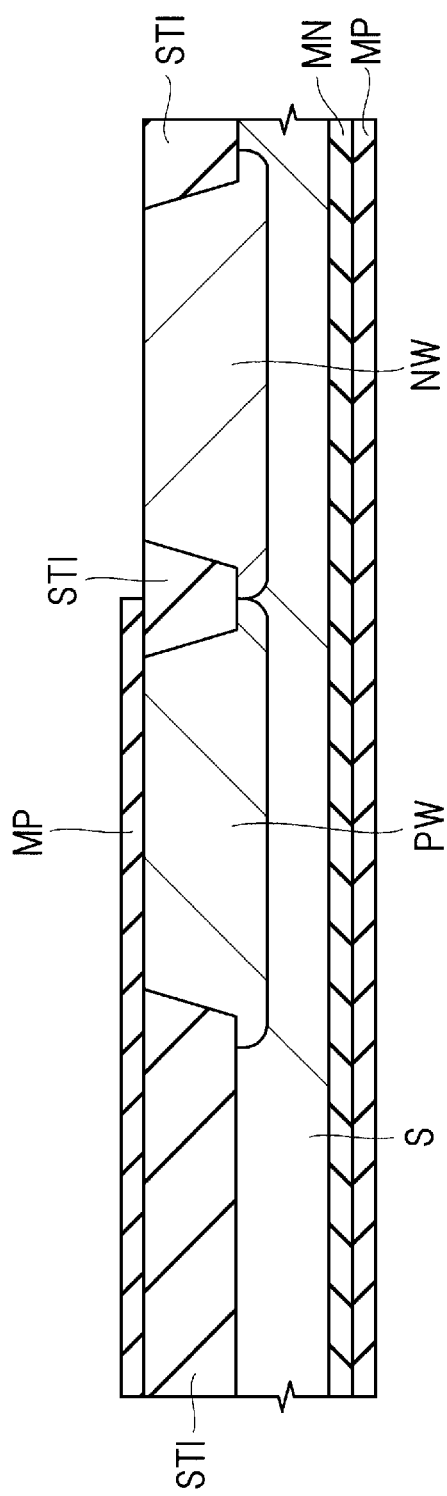
FIG. 8 is a cross-sectional diagram showing a manufacturing step of the semiconductor device of the first embodiment, and is the cross-sectional diagram showing the manufacturing step of the semiconductor device subsequent to FIG. 7.

After the p-type well PW is formed by using the mask film MN as a mask, as shown in FIG. 8, the formation region of the n-channel type MISFET (NT) is covered with a mask film MP including a silicon oxide film, an n-type impurity (arsenic (As) or phosphorus (P)) is ion-implanted, and thereby the n-type well NW is formed. The mask film MP formed at this time is, similarly to the film MN, formed also on the back surface side of the semiconductor substrate S. Consequently, a stacked film of the mask film MN and the mask film MP is formed on the back surface side of the semiconductor substrate S from the substrate side. Next, heat treatment for activating the implanted impurity, and the mask film MP (silicon oxide film) is removed by dry etching.

Figure 9:
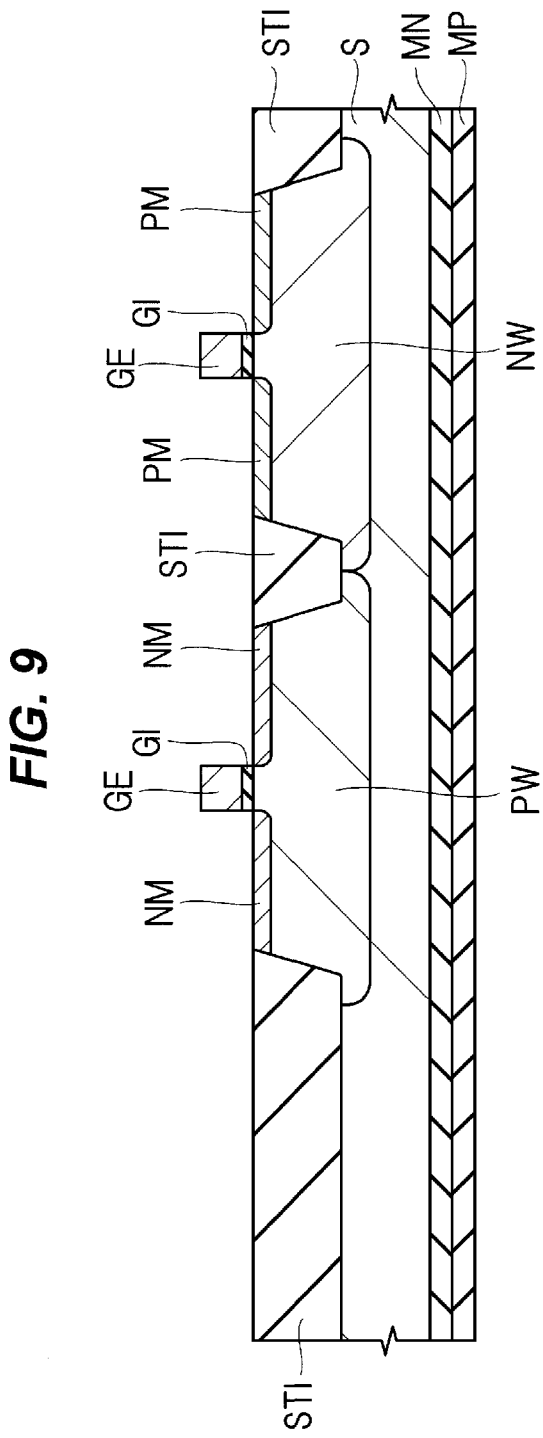
FIG. 9 is a cross-sectional diagram showing a manufacturing step of the semiconductor device of the first embodiment, and is the cross-sectional diagram showing the manufacturing step of the semiconductor device subsequent to FIG. 8.

Next, as shown in FIG. 9, the gate electrode GE is formed on the main surface (main surfaces of the p-type well PW and the n-type well NW) of the semiconductor substrate S via the gate insulating film GI. For example, the gate insulating film GI including the silicon oxide film is formed by thermally oxidizing the main surface (main surfaces of the p-type well PW and the n-type well NW) of the semiconductor substrate S. As the gate insulating film GI, a silicon nitride film and a silicon oxynitride film may be used in addition to the silicon oxide film. In addition, a high dielectric constant film (a so-called high-k film) may be used as the gate insulating film GI. In addition, the gate insulating film GI may be formed using another film formation method, such as the CVD method, in addition to a thermal oxidation method.

Next, a silicon film is formed as a conductive film (a conductor film). As the silicon film, for example, a polycrystalline silicon film is formed using the CVD method or the like. The gate electrode GE is formed by patterning the polycrystalline silicon film using the photolithography technology and the etching technology. It is to be noted that an impurity may be implanted into a material (the polycrystalline silicon film here) that configures the gate electrode GE according to a characteristic of each MISFET (NT, PT).

Next, source/drain regions are formed in the semiconductor substrate S (the p-type well PW, the n-type well NW) of both sides of each gate electrode GE.

First, the n-type impurity, such as arsenic (As) or phosphorus (P), is implanted into the p-type well PW of the both sides of the gate electrode GE, and the $n^-$ type semiconductor regions NM are formed (FIG. 9). The $n^-$ type semiconductor regions NM are formed on the side walls of the gate electrode GE in a self-aligned manner. In addition, the p-type impurity, such as boron (B), is implanted into the n-type well NW of the both sides of the gate electrode GE, and the $p^-$ type semiconductor regions PM are formed (FIG. 9). The $p^-$ type semiconductor regions PM are formed on the side walls of the gate electrode GE in a self-aligned manner.

Figure 10:
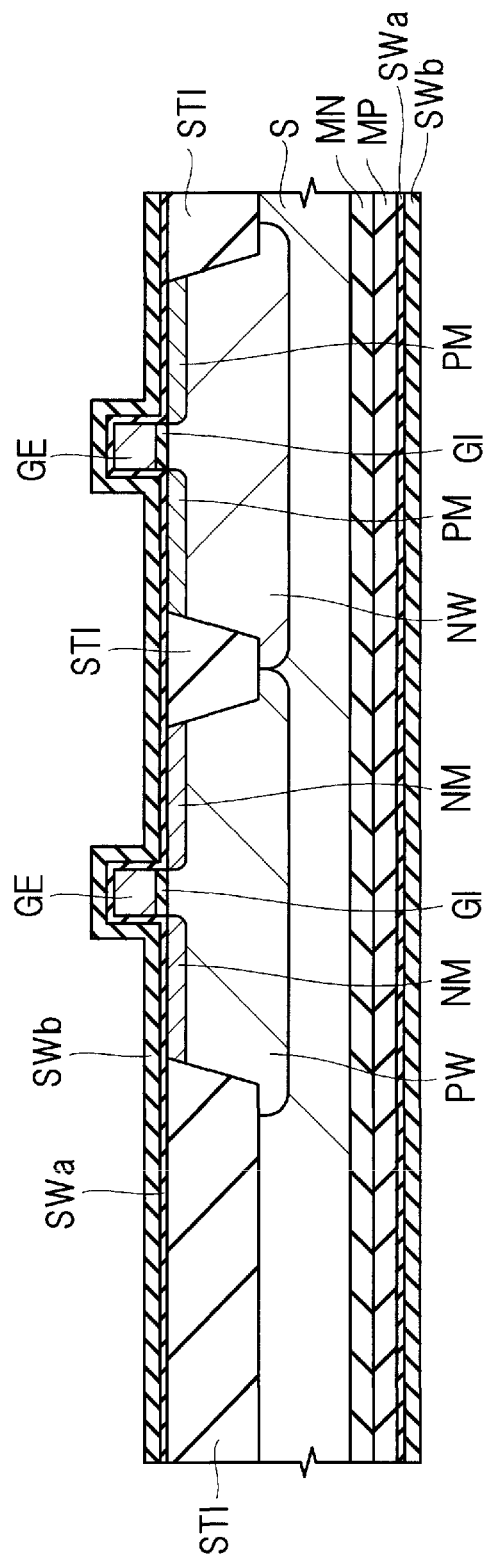
FIG. 10 is a cross-sectional diagram showing a manufacturing step of the semiconductor device of the first embodiment, and is the cross-sectional diagram showing the manufacturing step of the semiconductor device subsequent to FIG. 9.

Next, the side wall insulating film (a side wall film) SW is formed on the side wall portions of the gate electrode GE. For example, as shown in FIG. 10, an insulating film that configures the side wall insulating film SW is formed over the whole main surface of the semiconductor substrate S. Here, the stacked film of the silicon oxide film SWa and the silicon nitride film SWb is used. The silicon oxide film SWa is formed over the whole main surface of the semiconductor substrate S, for example, using a batch-type CVD apparatus. Next, the silicon nitride film SWb is formed over the silicon oxide film SWa, for example, using a batch-type low-pressure CVD apparatus. As a result, the stacked film of the silicon oxide film SWa and the silicon nitride film SWb is formed over the whole main surface of the semiconductor substrate S. At this time, the stacked film of the silicon oxide film SWa and the silicon nitride film SWb is formed also on the back surface of the semiconductor substrate S similarly to the cases of the above-mentioned mask films MP and MN. Consequently, the mask film MN, the mask film MP, and the stacked film of the silicon oxide film SWa and the silicon nitride film SWb are formed on the back surface of the semiconductor substrate S from the substrate side. It is to be noted that as the side wall insulating film SW, an insulating film, such as a single-layer silicon oxide film and a single-layer silicon nitride film, may be used in addition to the stacked film of the silicon oxide film SWa and the silicon nitride film SWb.

Figure 11:
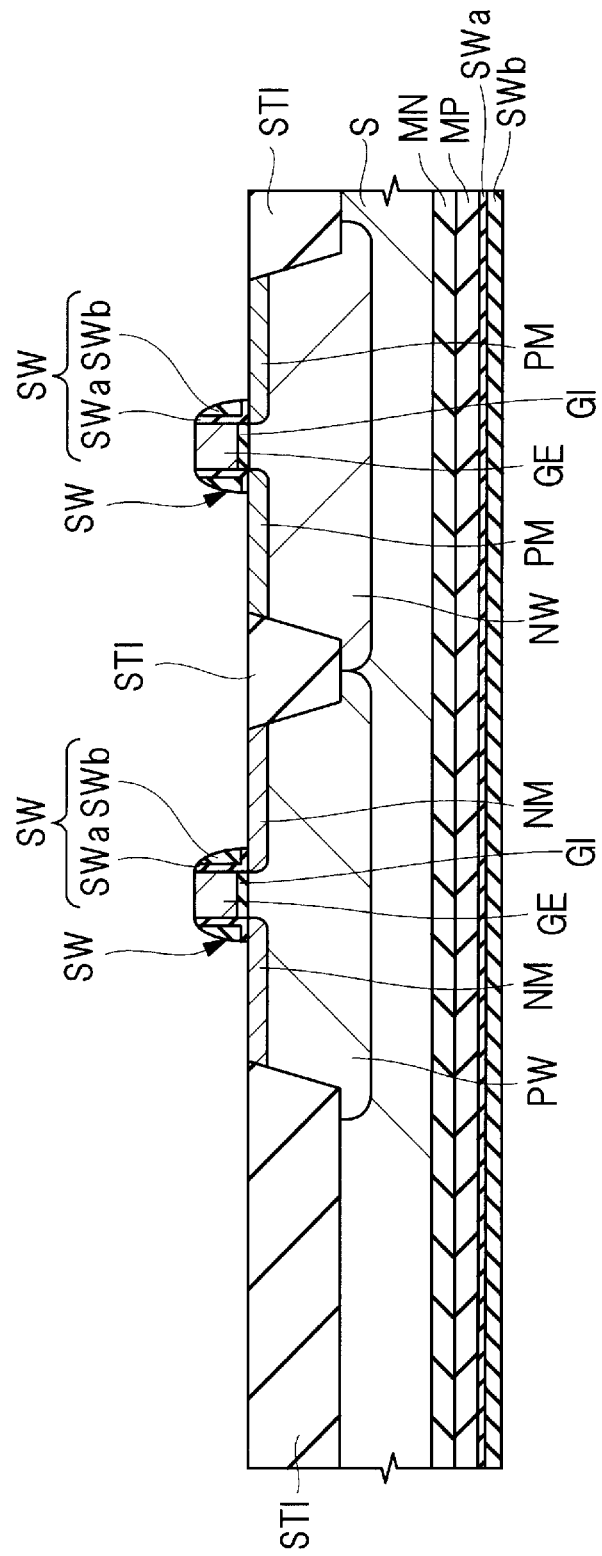
FIG. 11 is a cross-sectional diagram showing a manufacturing step of the semiconductor device of the first embodiment, and is the cross-sectional diagram showing the manufacturing step of the semiconductor device subsequent to FIG. 10.

Next, as shown in FIG. 11, the side wall insulating film SW is formed on the side wall portions of the gate electrode GE by etching back the stacked film of the silicon oxide film SWa and the silicon nitride film SWb. The etch back of the stacked film is performed by a single-wafer type etching apparatus. Consequently, the stacked film of the silicon oxide film SWa and the silicon nitride film SWb on the back surface side of the semiconductor substrate S becomes a state of remaining without being removed.

Figure 12:
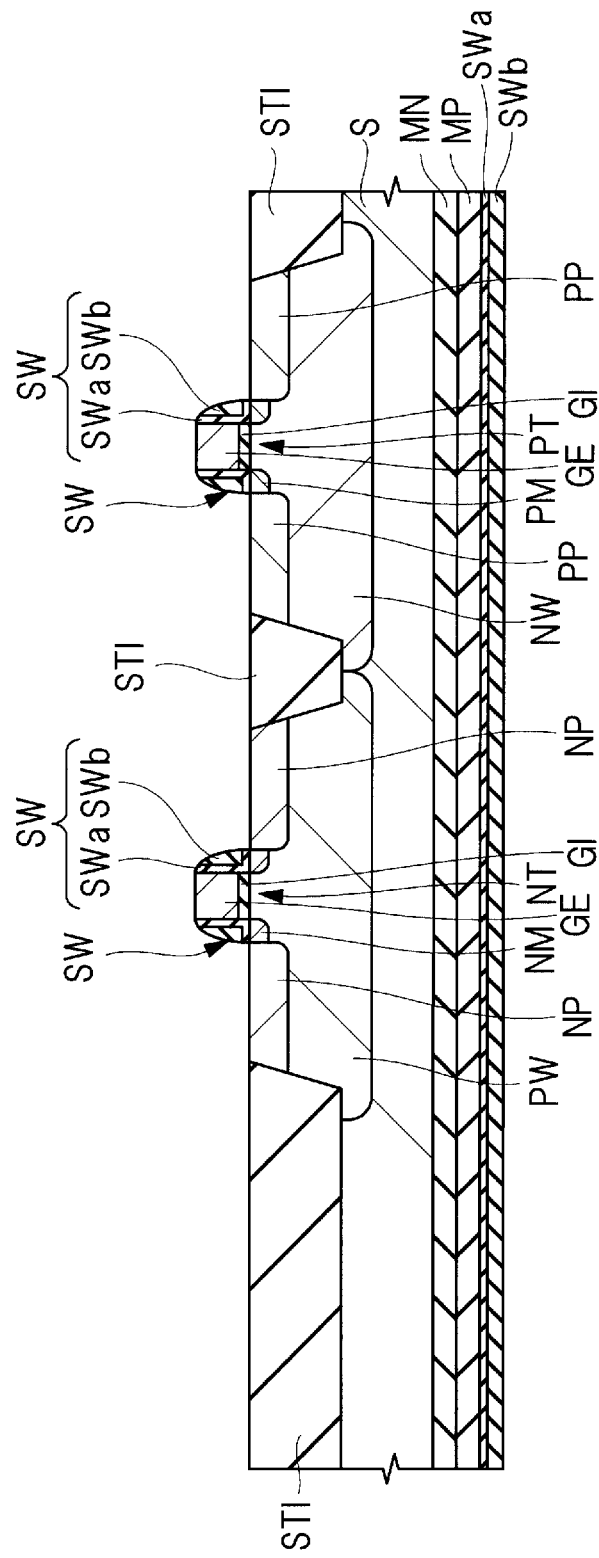
FIG. 12 is a cross-sectional diagram showing a manufacturing step of the semiconductor device of the first embodiment, and is the cross-sectional diagram showing the manufacturing step of the semiconductor device subsequent to FIG. 11.

Next, as shown in FIG. 12, the n-type impurity, such as arsenic (As) or phosphorus (P), is implanted into the p-type well PW on both sides of a composite body of the gate electrode GE and the side wall insulating film SW, and the n$^+$ type semiconductor regions NP are formed. The n$^+$ type semiconductor regions NP are formed on the side walls of the side wall insulating film SW in a self-aligned manner. The n$^+$ type semiconductor regions NP are formed as semiconductor regions that have a higher impurity concentration and a deeper junction depth than the n$^-$ type semiconductor regions NM. In addition, the p-type impurity, such as boron (B), is implanted into the n-type well NW of the both sides of the composite body of the gate electrode GE and the side wall insulating film SW, and the p$^+$ type semiconductor regions PP are formed. The p$^+$ type semiconductor regions PP are formed on the side walls of the side wall insulating film SW in a self-aligned manner. The p$^+$ type semiconductor regions PP are formed as semiconductor regions that have a higher impurity concentration and a deeper junction depth than the p$^-$ type semiconductor regions PM. Next, heat treatment for activating the implanted impurity is performed. As a result, the source/drain regions of the LDD structure including the n$^-$ type semiconductor region NM and the n$^+$ type semiconductor region NP are formed in the p-type well PW of the both sides of the gate electrode GE, and the source/drain regions of the LDD structure including the p$^-$ type semiconductor region PM and the p$^+$ type semiconductor region PP are formed in the n-type well NW of the both sides of the gate electrode GE.

According to the above steps, the n-channel type MISFET (NT) is formed on a main surface of the p-type well PW, and the p-channel type MISFET (PT) is formed on a main surface of the n-type well NW.

Next, a metal silicide film SIL is formed at upper parts of the gate electrode GE, the n$^+$ type semiconductor region NP, and the P$^+$ type semiconductor region PP, respectively using a salicide technology.

Figure 13:
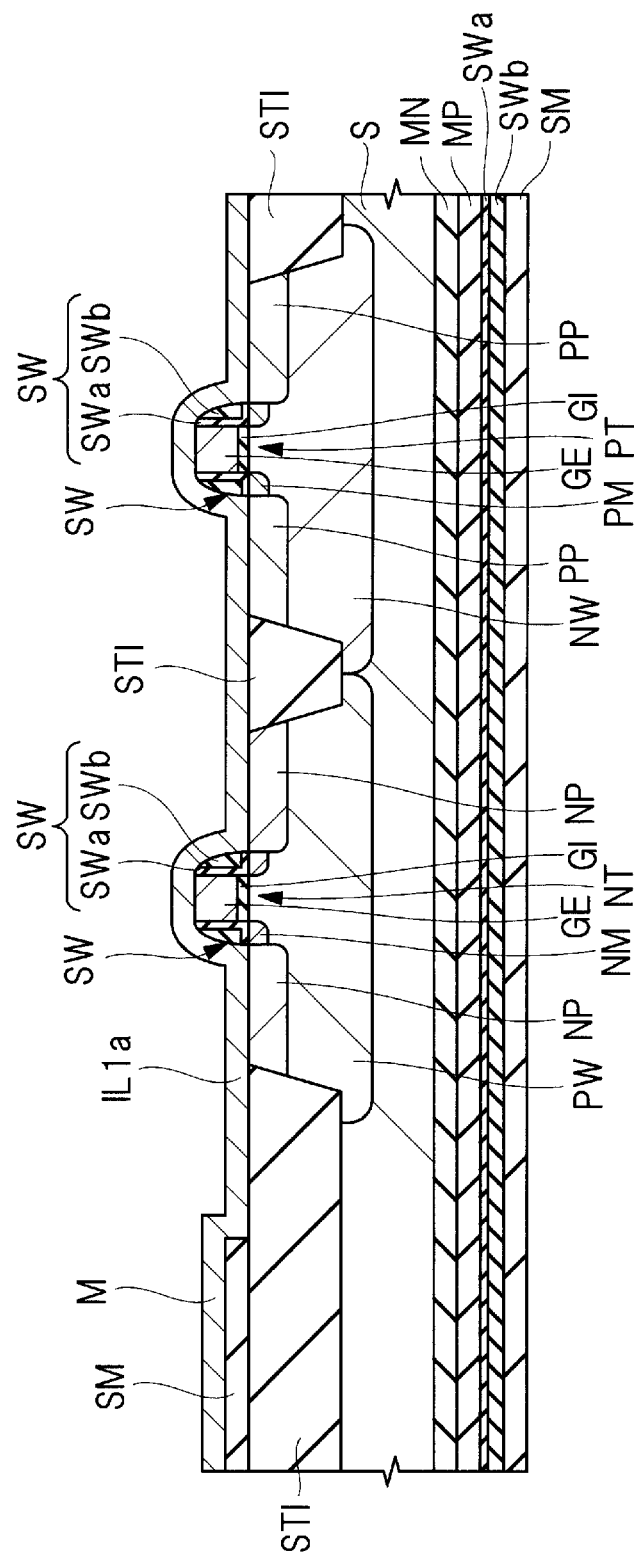
FIG. 13 is a cross-sectional diagram showing a manufacturing step of the semiconductor device of the first embodiment, and is the cross-sectional diagram showing the manufacturing step of the semiconductor device subsequent to FIG. 12.
Figure 14:
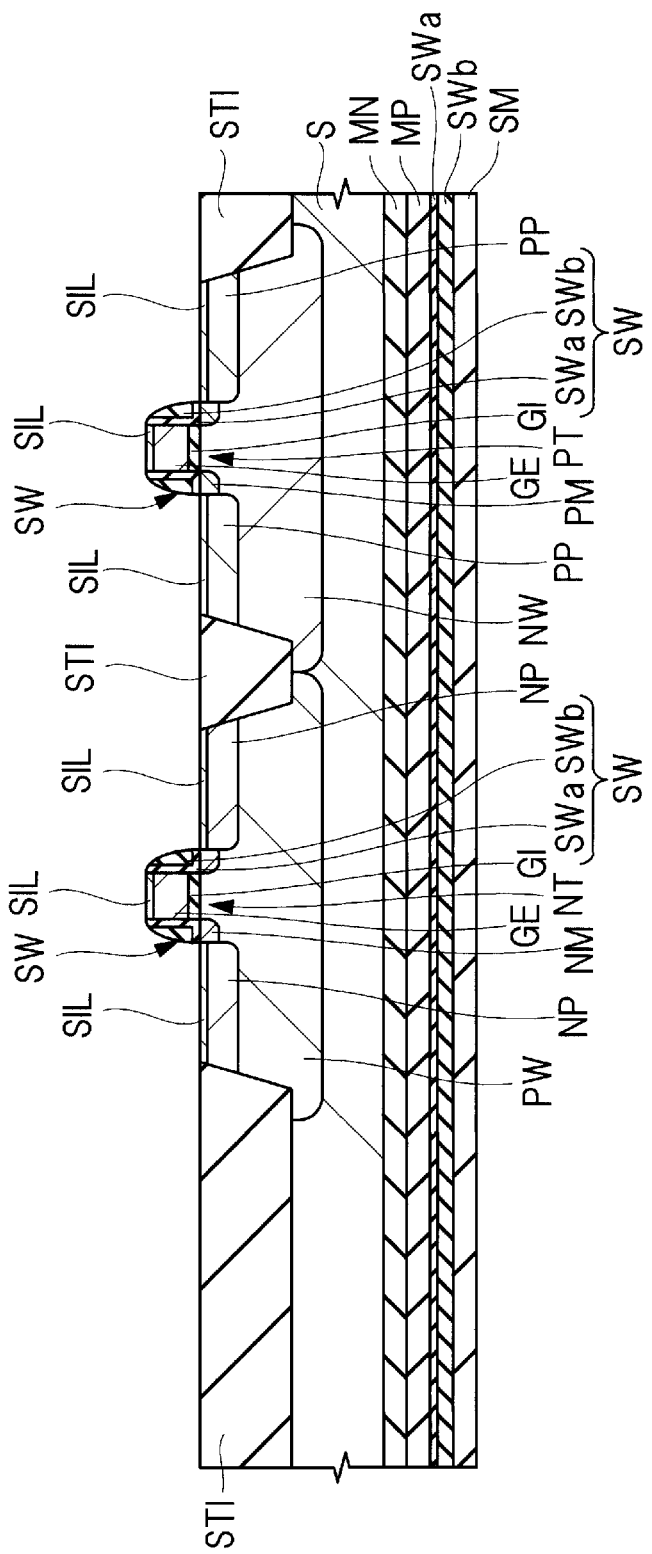
FIG. 14 is a cross-sectional diagram showing a manufacturing step of the semiconductor device of the first embodiment, and is the cross-sectional diagram showing the manufacturing step of the semiconductor device subsequent to FIG. 13.

First, a silicon oxide film is formed as a silicide mask SM at a region (not shown) where the metal silicide film SIL is not formed, for example, using the batch-type CVD apparatus (refer to FIG. 13). At this time, similarly to the above-mentioned cases of the mask films MP and MN, and the stacked film of the silicon oxide film SWa and the silicon nitride film SWb, the silicide mask SM (silicon oxide film) is formed also on the back surface of the semiconductor substrate S. Consequently, the mask film MN, the mask film MP, the stacked film of the silicon oxide film SWa and the silicon nitride film SWb, and the silicide mask SM are formed on the back surface of the semiconductor substrate S from the substrate side.

Next, the silicide mask SM (silicon oxide film) over the n-channel type MISFET (NT) and the p-channel type MISFET (PT) is removed using the photolithography technology and the etching technology (refer to FIG. 13).

Next, as shown in FIG. 13, a metal film M is formed over the whole surface of the semiconductor substrate S, heat treatment is applied thereto, and thereby the gate electrode GE, the n$^+$ type semiconductor region NP, and the P$^+$ type semiconductor region PP are made to react with the metal film M. As a result, the metal silicide film SIL is formed at the upper parts of the gate electrode GE, the n$^+$ type semiconductor region NP, and the P$^+$ type semiconductor region PP, respectively. The above-described metal film, for example, includes a cobalt (Co) film or a nickel (Ni) film, and can be formed using a sputtering method or the like. Next, the unreacted metal film M is removed (refer to FIG. 14). It is to be noted that a formation step of the metal silicide film SIL may be skipped.

Figure 15:
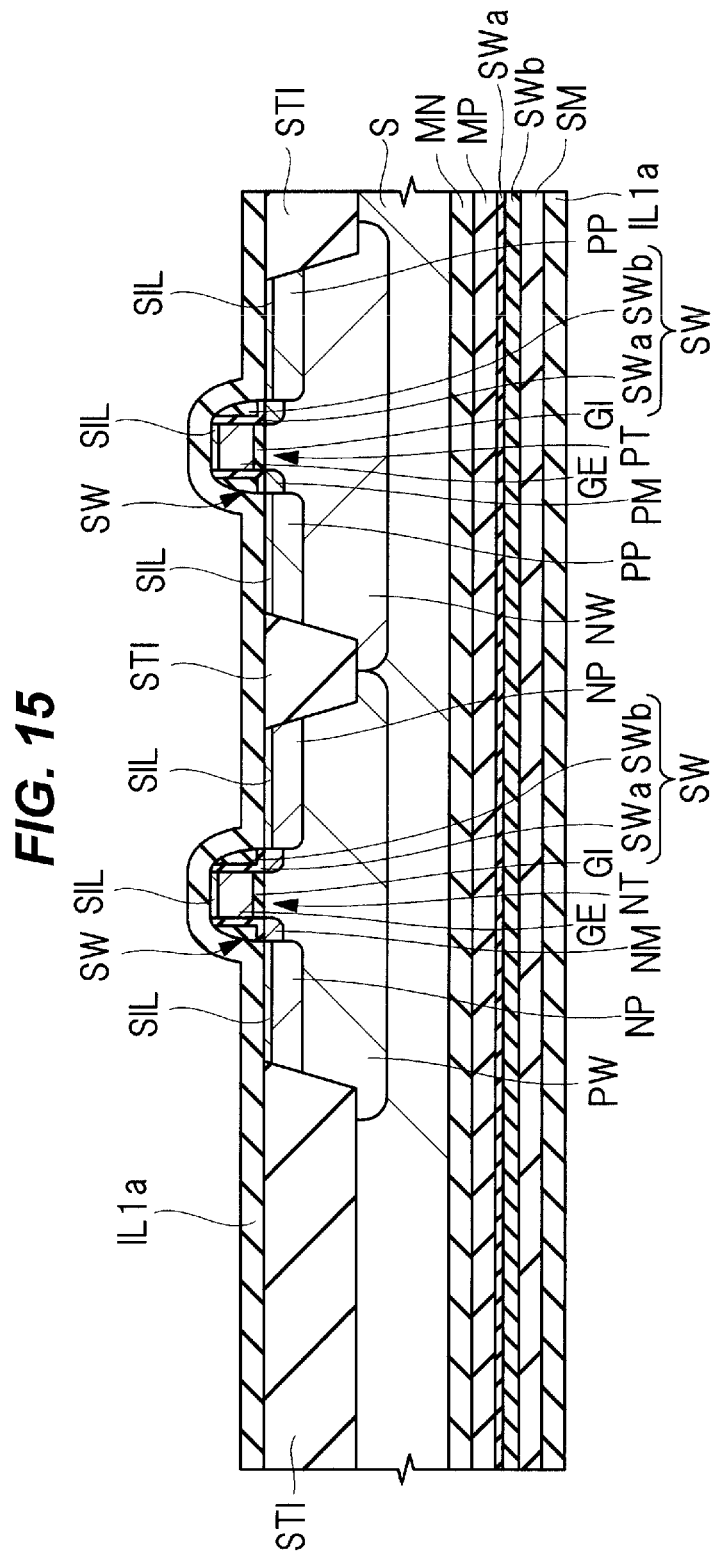
FIG. 15 is a cross-sectional diagram showing a manufacturing step of the semiconductor device of the first embodiment, and is the cross-sectional diagram showing the manufacturing step of the semiconductor device subsequent to FIG. 14.

Next, the insulating film (interlayer insulating film) IL1 is formed over the n-channel type MISFET (NT) and the p-channel type MISFET (PT). First, as shown in FIG. 15, the silicon nitride film IL1$a$ is formed so as to cover upper sides of the source/drain regions of the MISFETs (NT, PT) and the gate electrode GE. The silicon nitride film IL1$a$ is formed using the batch-type CVD apparatus. At this time, similarly to the above-mentioned mask films MP, MN, and the like, the silicon nitride film IL1$a$ is formed also on the back surface of the semiconductor substrate S. Consequently, the mask film MN, the mask film MP, the stacked film of the silicon oxide film SWa and the silicon nitride film SWb, the silicide mask SM, and the silicon nitride film IL1$a$ are formed on the back surface of the semiconductor substrate S from the substrate side.

Figure 16:
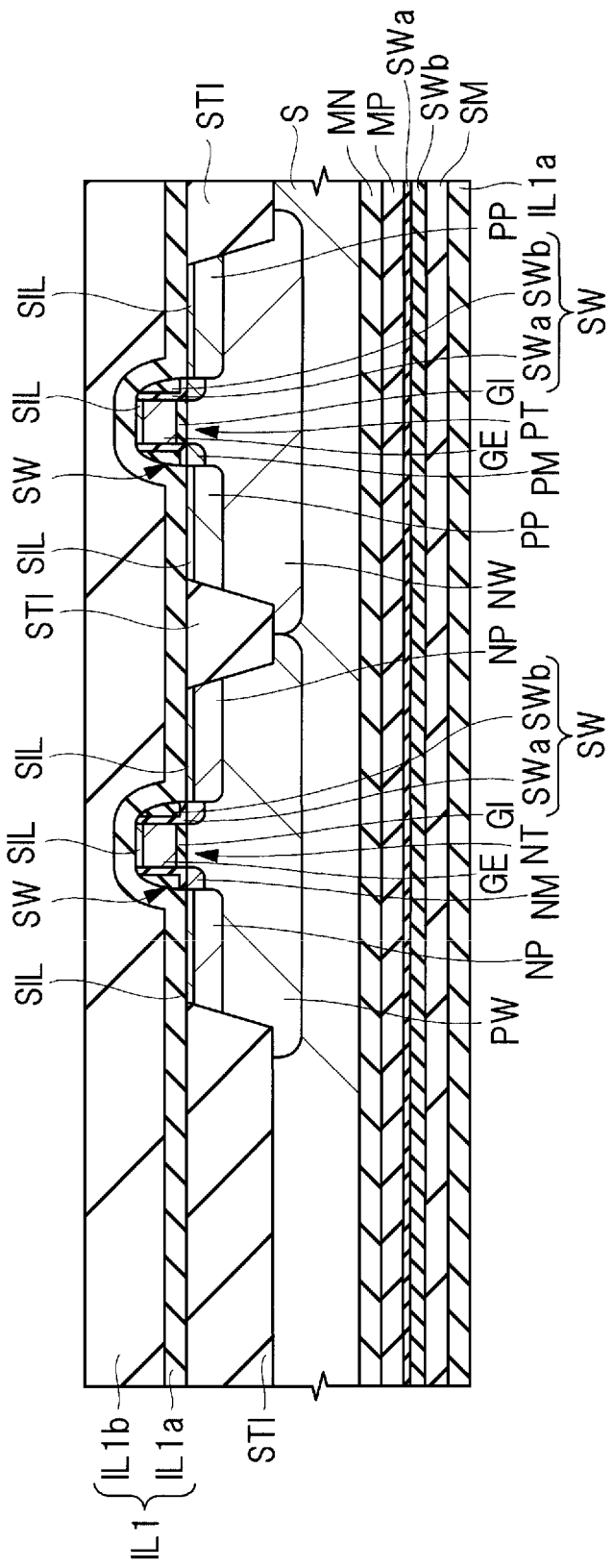
FIG. 16 is a cross-sectional diagram showing a manufacturing step of the semiconductor device of the first embodiment, and is the cross-sectional diagram showing the manufacturing step of the semiconductor device subsequent to FIG. 15.

Next, as shown in FIG. 16, the silicon oxide film IL1$b$ formed thicker than the silicon nitride film IL1$a$ is formed over the silicon nitride film IL1$a$ using the CVD method or the like. As a result, the interlayer insulating film IL1 including a stacked film of the silicon nitride film IL1$a$ and the silicon oxide film IL1$b$ can be formed. After formation of the interlayer insulating film IL1, an upper surface of the interlayer insulating film IL1 is planarized using a CMP method or the like if needed.

Figure 17:
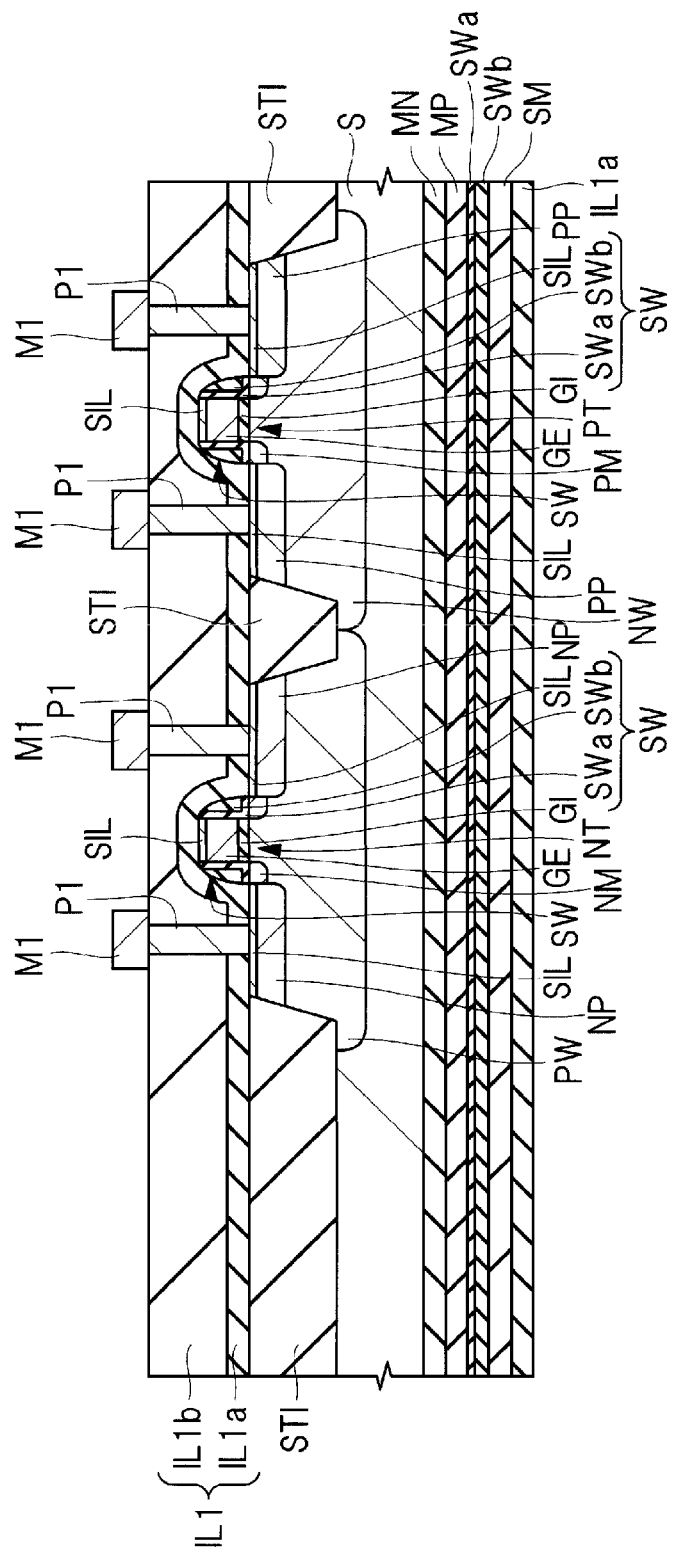
FIG. 17 is a cross-sectional diagram showing a manufacturing step of the semiconductor device of the first embodiment, and is the cross-sectional diagram showing the manufacturing step of the semiconductor device subsequent to FIG. 16.

Next, as shown in FIG. 17, contact holes are formed in the interlayer insulating film IL1 by selectively removing the interlayer insulating film IL1 using the photolithography technology and the etching technology. At this time, utilizing an etching selection ratio of the silicon nitride film IL1$a$ and the silicon oxide film IL1$b$, first, the silicon oxide film IL1$b$ is etched, the exposed silicon nitride film IL1$a$ is further etched, and thereby the contact holes can be formed accurately.

Next, a stacked film of a barrier conductor film (not shown) and a main conductor film is formed over the interlayer insulating film IL1 including insides of the contact holes. Next, the plugs P1 are formed by removing the unnecessary main conductor film and barrier conductor film over the interlayer insulating film IL1 by means of the CMP method or an etch-back method. These plugs P1 are, for example, formed at the upper parts of the n$^+$ type semiconductor region NP and the P$^+$ type semiconductor region PP via the metal silicide film SIL. In addition, the plugs P1 may be formed at the upper part of the gate electrode GE. It is to be noted that, for example, a titanium film, a titanium nitride film, or a stacked film thereof can be used as the barrier conductor film. In addition, a tungsten film or the like can be used as the main conductor film.

Next, the wirings M1 including the conductive film are formed over the interlayer insulating film IL1 in which the plugs P1 have been buried. For example, a stacked film including a titanium/titanium nitride film, an aluminum film, and a titanium/titanium nitride film is sequentially deposited over the interlayer insulating film IL1 and the plugs P1 as the conductive film using the sputtering method or the like. The stacked film of the titanium/titanium nitride film is also called the barrier conductor film. Next, the wirings M1 are formed over the plugs P1 by patterning the above-described stacked film using the photolithography technology and the etching technology.

The above-described aluminum film for forming the wirings M1 is not limited to a pure aluminum film, and can be used a conductive material film (however, the conductive material film exhibiting metallic conduction) containing aluminum as a principal component. For example, a compound film or an alloy film of Al (aluminum) and Si (silicon) can be used. In addition, a composition ratio of Al (aluminum) in the aluminum film is desirably larger than 50 atom % (i.e., the aluminum film is the Al-rich one). The same applies not only to the above-described aluminum film for forming the wirings M1 but to the aluminum films for forming the wirings M2 to M3.

Figure 18:
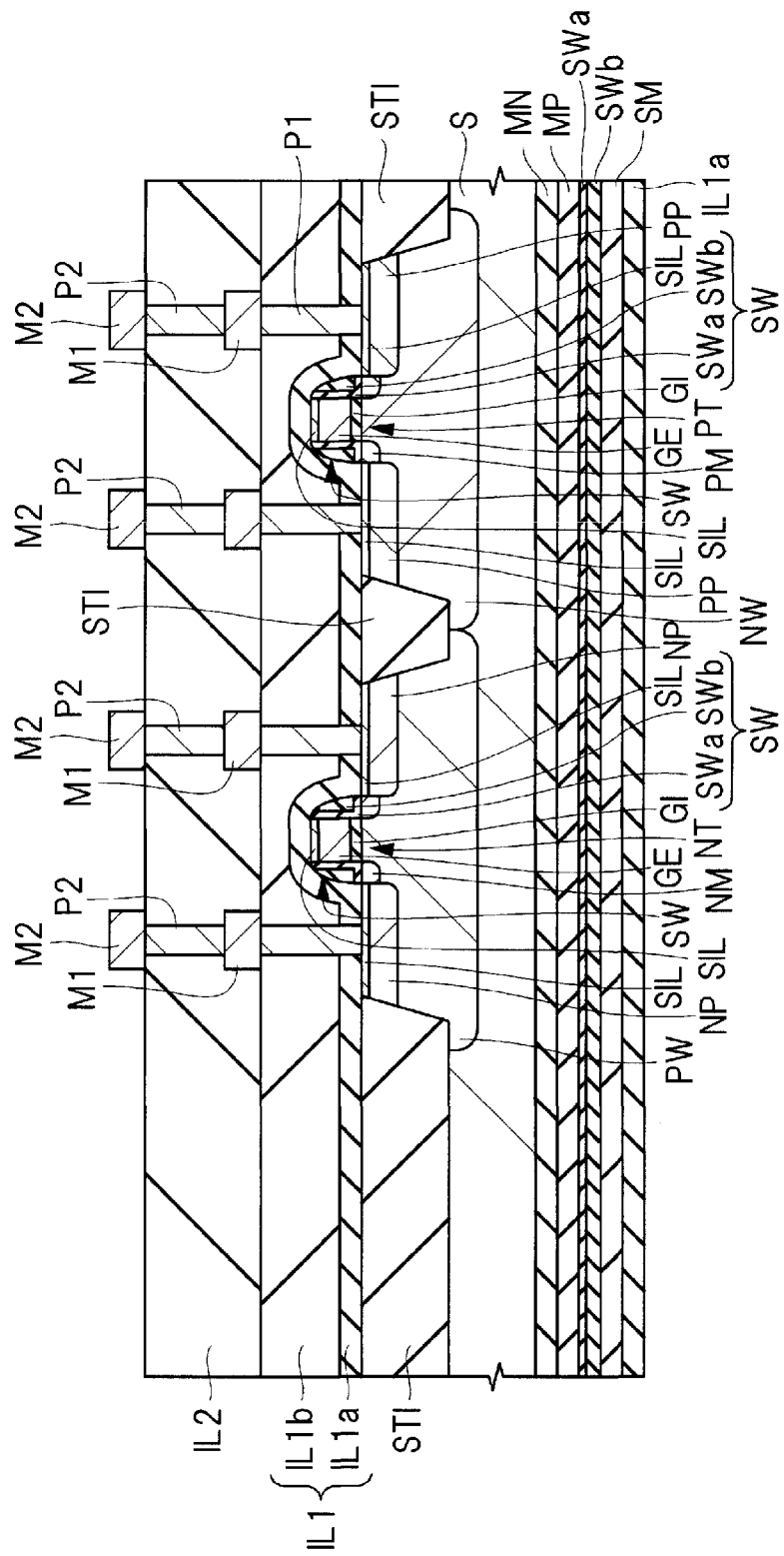
FIG. 18 is a cross-sectional diagram showing a manufacturing step of the semiconductor device of the first embodiment, and is the cross-sectional diagram showing the manufacturing step of the semiconductor device subsequent to FIG. 17.

Next, as shown in FIG. 18, the interlayer insulating film IL2 is formed over the wirings M1. For example, a silicon oxide film is deposited over the wirings M1 by the CVD method or the like.

Next, contact holes are formed in the interlayer insulating film IL2 by selectively removing the interlayer insulating film IL2 using the photolithography technology and the etching technology. Next, the plugs P2 are formed in the interlayer insulating film IL2 by burying a conductive film inside the contact holes. These plugs P2 can be formed similarly to the plugs P1. Next, the wirings M2 including the conductive film are formed over the plugs P2. For example, a stacked film including a titanium/titanium nitride film, an aluminum film, and a titanium/titanium nitride film is sequentially deposited over the interlayer insulating film IL2 and the plugs P2 as the conductive film using the sputtering method or the like. Next, the wirings M2 are formed over the above-described plugs P2 by patterning the above-described stacked film using the photolithography technology and the etching technology.

Figure 19:
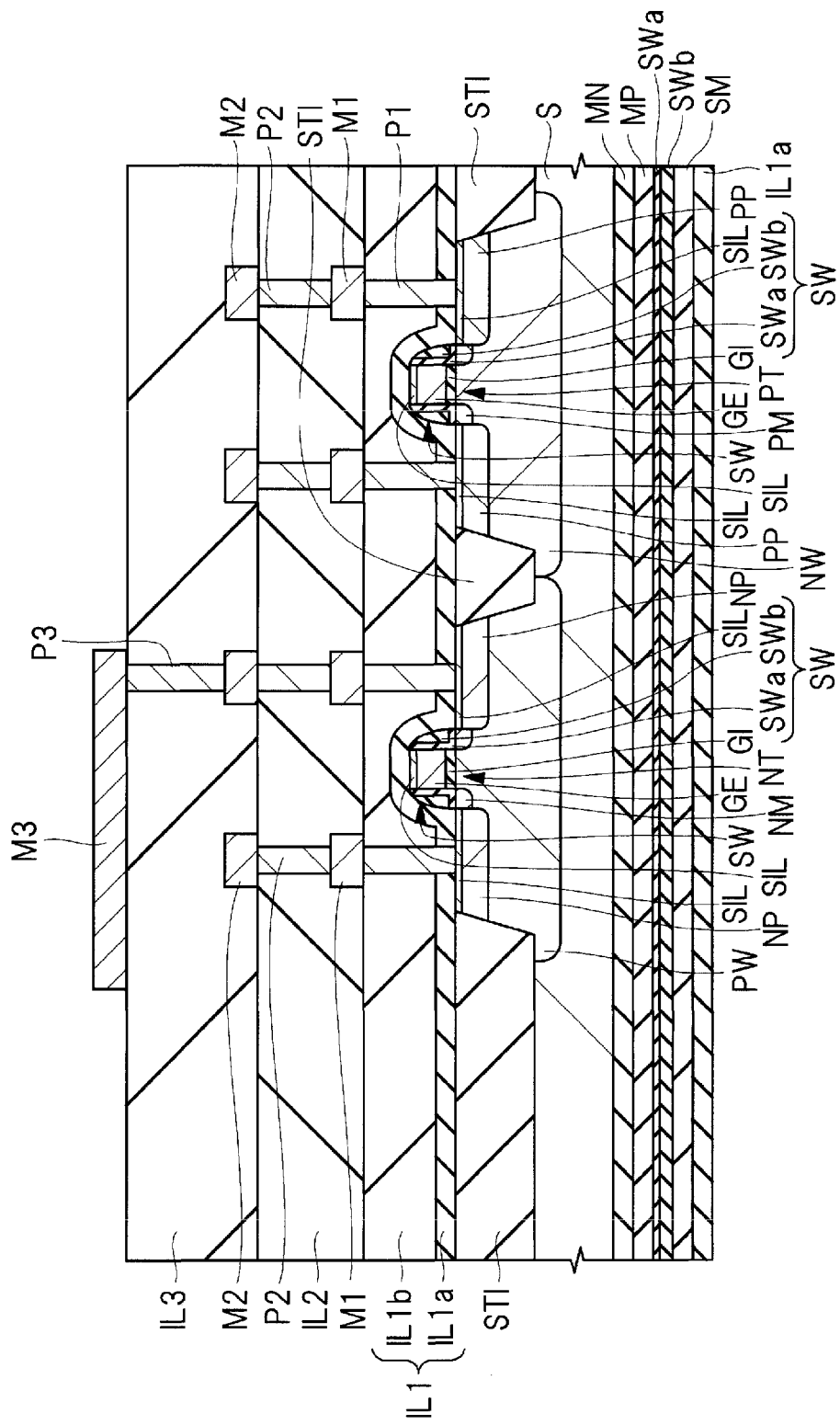
FIG. 19 is a cross-sectional diagram showing a manufacturing step of the semiconductor device of the first embodiment, and is the cross-sectional diagram showing the manufacturing step of the semiconductor device subsequent to FIG. 18.

Next, as shown in FIG. 19, the interlayer insulating film IL3 is formed over the wirings M2. For example, a silicon oxide film is deposited over the wirings M2 by the CVD method or the like. Next, a contact hole is formed in the interlayer insulating film IL3 by selectively removing the interlayer insulating film IL3 using the photolithography technology and the etching technology. Next, the plug P3 is formed in the interlayer insulating film IL3 by burying a conductive film inside the contact hole. This plug P3 can be formed similarly to the plugs P1. Next, the wiring M3 including the conductive film is formed over the plug P3. For example, a stacked film including a titanium/titanium nitride film, an aluminum film, and a titanium/titanium nitride film is sequentially deposited over the interlayer insulating film IL3 and the plug P3 as the conductive film using the sputtering method or the like. Next, the wiring M3 is formed over the above-described plug P3 by patterning the above-described stacked film using the photolithography technology and the etching technology.

Figure 20:
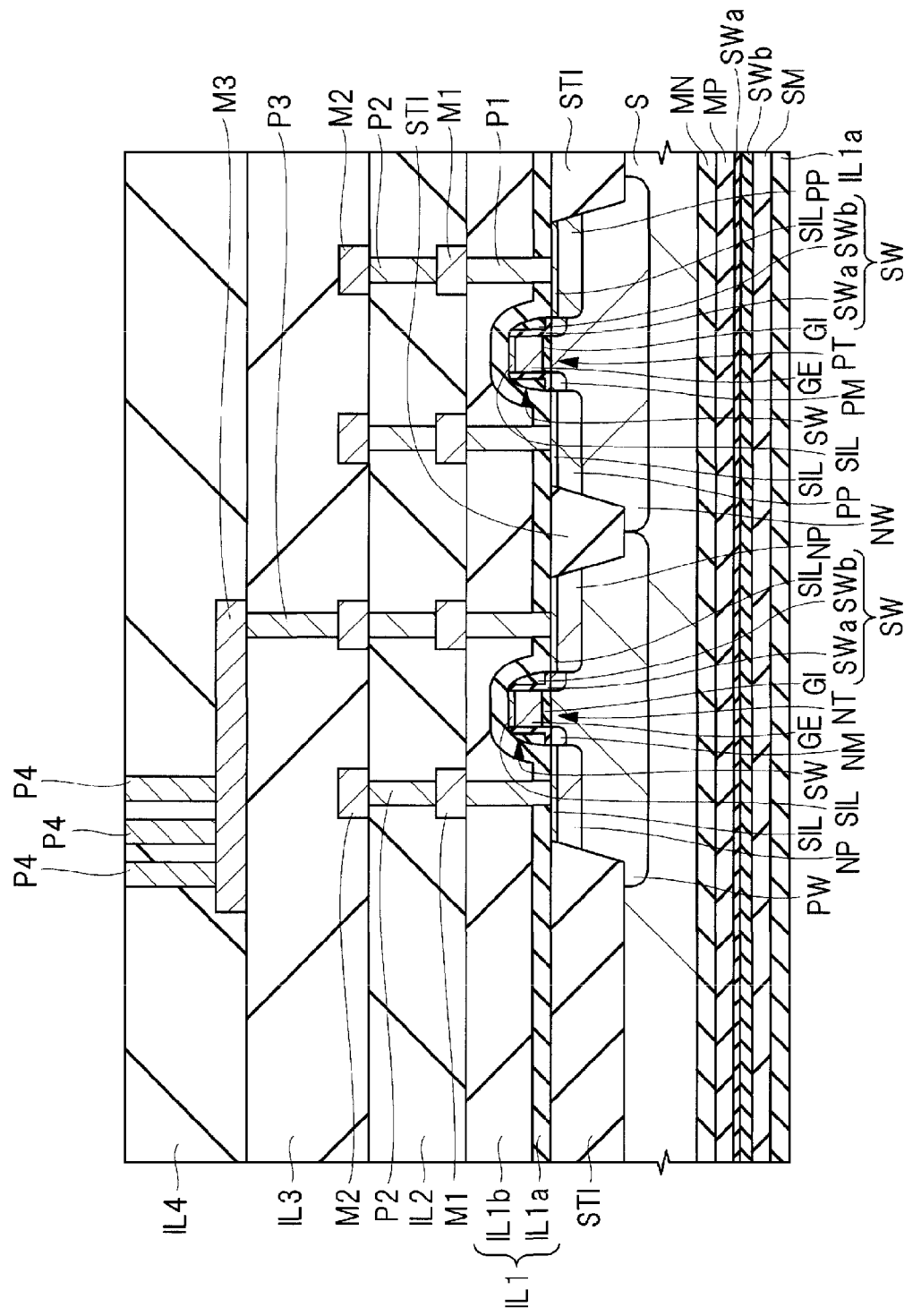
FIG. 20 is a cross-sectional diagram showing a manufacturing step of the semiconductor device of the first embodiment, and is the cross-sectional diagram showing the manufacturing step of the semiconductor device subsequent to FIG. 19.

Next, as shown in FIG. 20, the interlayer insulating film IL4 is formed over the wiring M3. For example, a silicon oxide film is deposited over the wiring M3 by the CVD method or the like. Next, contact holes are formed in the interlayer insulating film IL4 by selectively removing the interlayer insulating film IL4 using the photolithography technology and the etching technology. Next, the plugs P4 are formed in the interlayer insulating film IL4 by burying a conductive film inside the contact holes. These plugs P4 can be formed similarly to the plugs P1.

Figure 21:
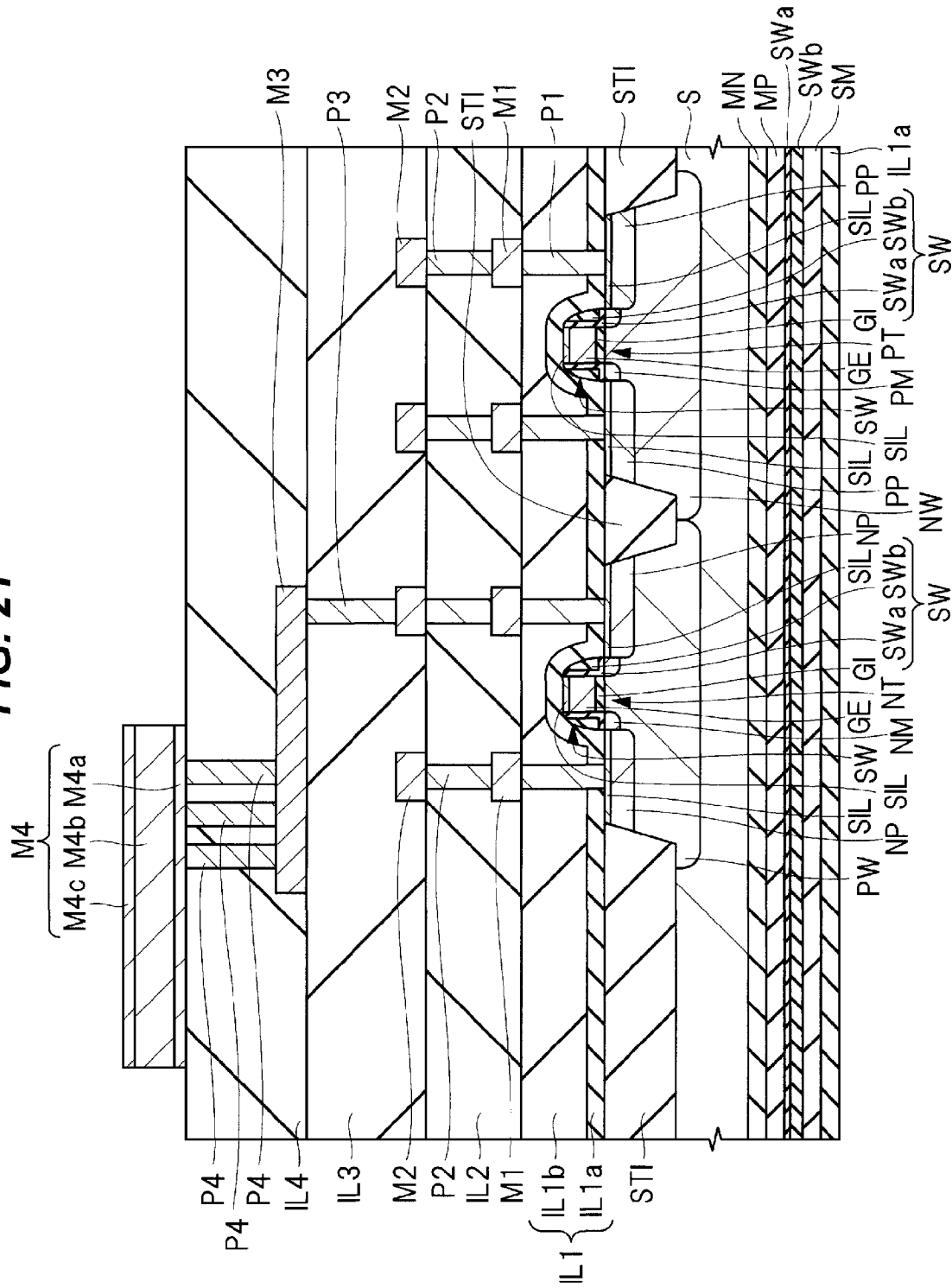
FIG. 21 is a cross-sectional diagram showing a manufacturing step of the semiconductor device of the first embodiment, and is the cross-sectional diagram showing the manufacturing step of the semiconductor device subsequent to FIG. 20.

Next, as shown in FIG. 21, the wiring M4 including the conductive film is formed over the plugs P4. For example, a stacked film including the titanium/titanium nitride film M4$a$, the aluminum film M4$b$, and the titanium film M4$c$ is sequentially deposited over the interlayer insulating film IL4 and the plugs P4 as the conductive film using the sputtering method or the like. Next, the wiring M4 is formed over the above-described plugs P4 by patterning the above-described stacked film using the photolithography technology and the etching technology. It is to be noted that at the time of the patterning of the wiring M4, for example, a silicon oxynitride film may be formed over the wiring M4 as an anti-reflection film. The silicon oxynitride film may be removed or may be made to remain over the wiring M4 after patterning of the wiring M4.

Figure 22:
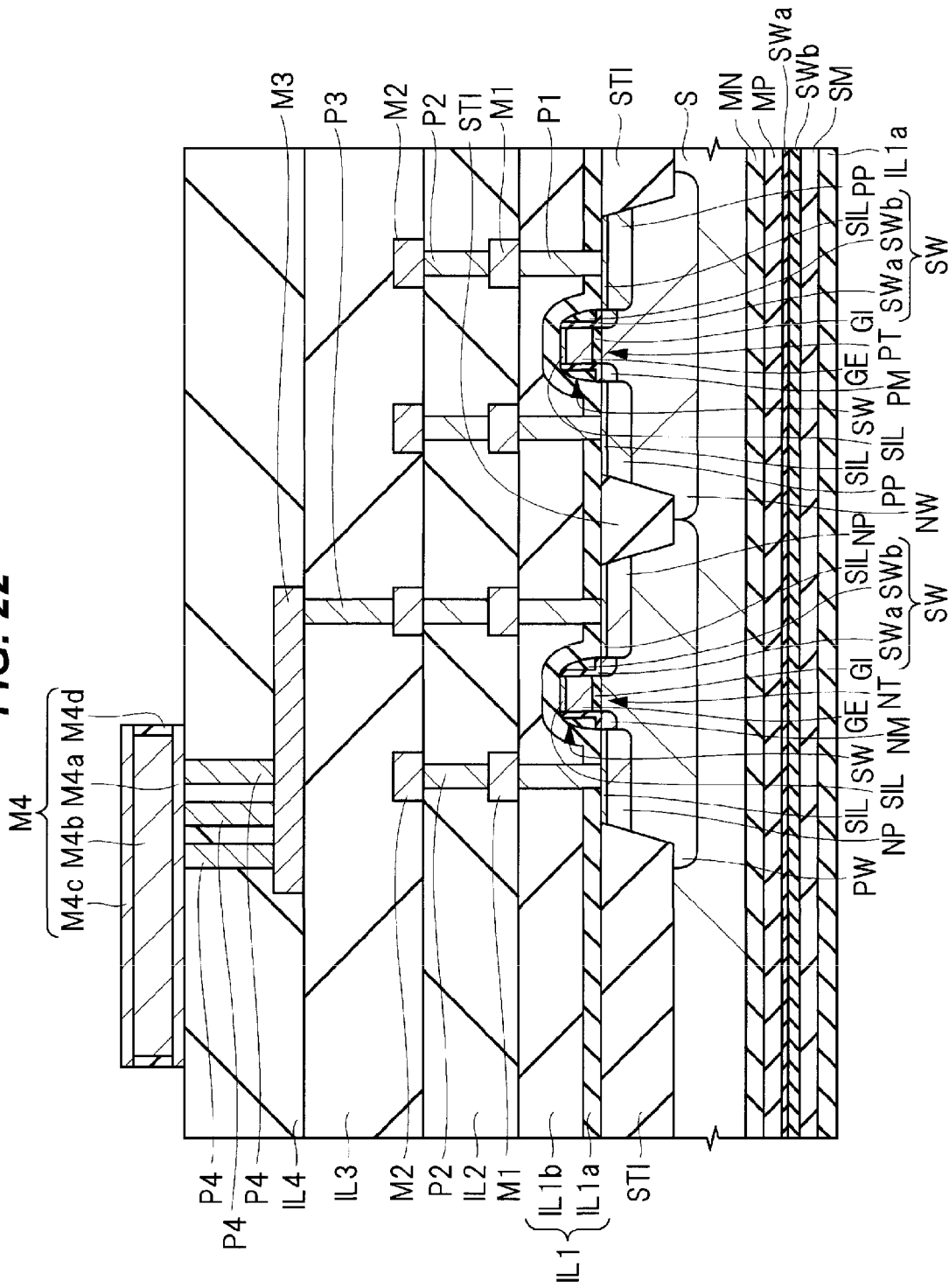
FIG. 22 is a cross-sectional diagram showing a manufacturing step of the semiconductor device of the first embodiment, and is the cross-sectional diagram showing the manufacturing step of the semiconductor device subsequent to FIG. 21.

Next, as shown in FIG. 22, passivation treatment (oxidation treatment) of side surfaces (side surfaces of the aluminum film M4$b$) of the wiring M4 is performed. For example, an aluminum oxide film (an $Al_2O_3$ film) M4$d$ is formed on the side surfaces (side surfaces of the aluminum film M4$b$) of the wiring M4 by performing oxygen plasma treatment on the wiring M4. For example, treatment is performed for 120 seconds under a condition of stage temperature: 250° C.; high frequency power: 2000 W; pressure inside the treatment chamber: 100 Pa; and $O_2$ gas flow rate: 7000 mL/min (sccm). According to such treatment, the aluminum oxide film having a film thickness of approximately 1 to 5 nm can be formed on the side surfaces of the wiring M4. It is to be noted that treatment using ozone ($O_3$) can also be performed for passivation treatment (oxidation treatment) in addition to the treatment using oxygen.

Figure 23:
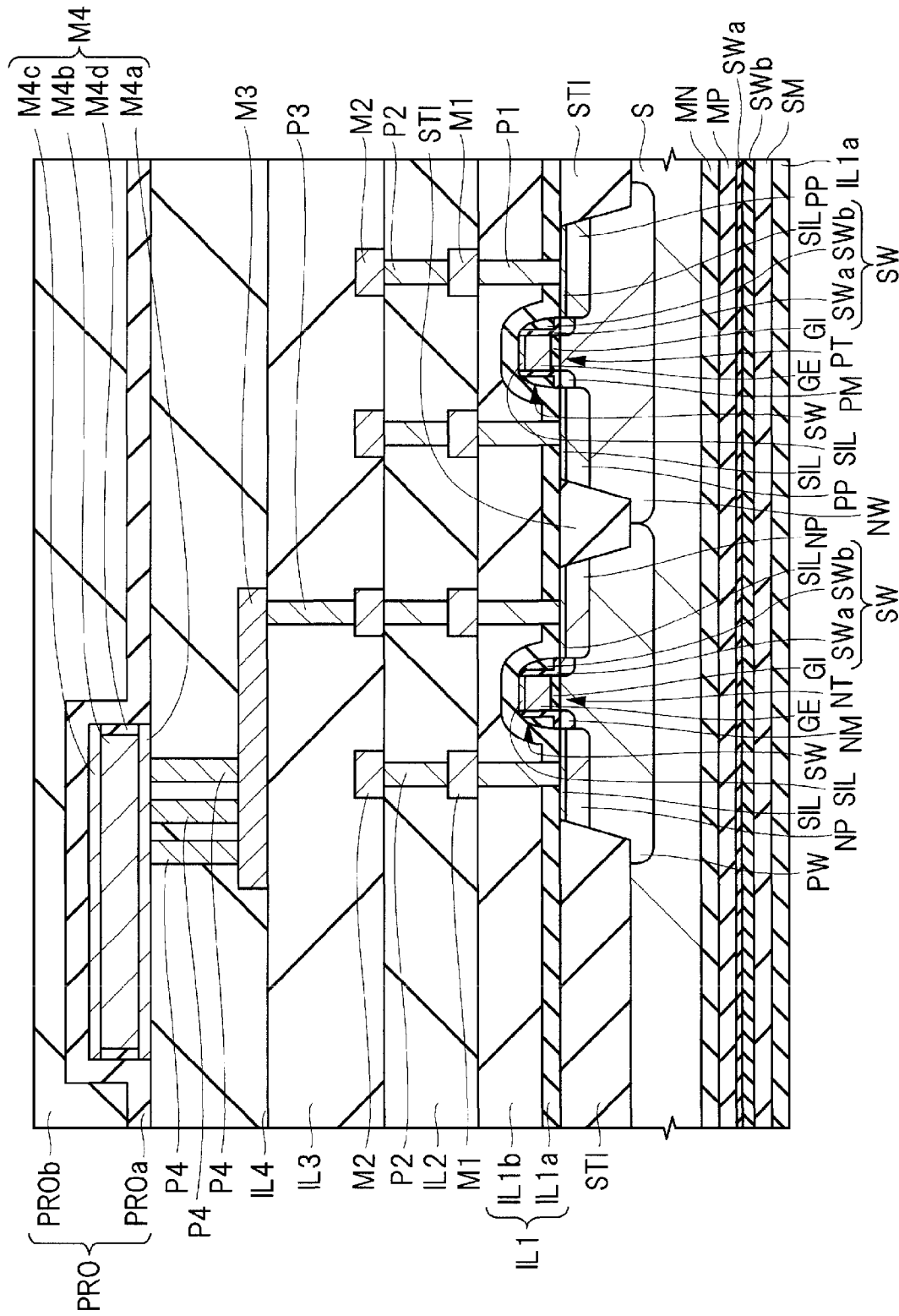
FIG. 23 is a cross-sectional diagram showing a manufacturing step of the semiconductor device of the first embodiment, and is the cross-sectional diagram showing the manufacturing step of the semiconductor device subsequent to FIG. 22.

Next, as shown in FIG. 23, the protection film PRO is formed over the wiring M4. For example, a silicon nitride film PROa is deposited over the interlayer insulating film IL4 including a top of the wiring M4 by the CVD method or the like. and further, a silicon oxide film PROb is deposited over the silicon nitride film PROa by the CVD method or the like.

Figure 24:
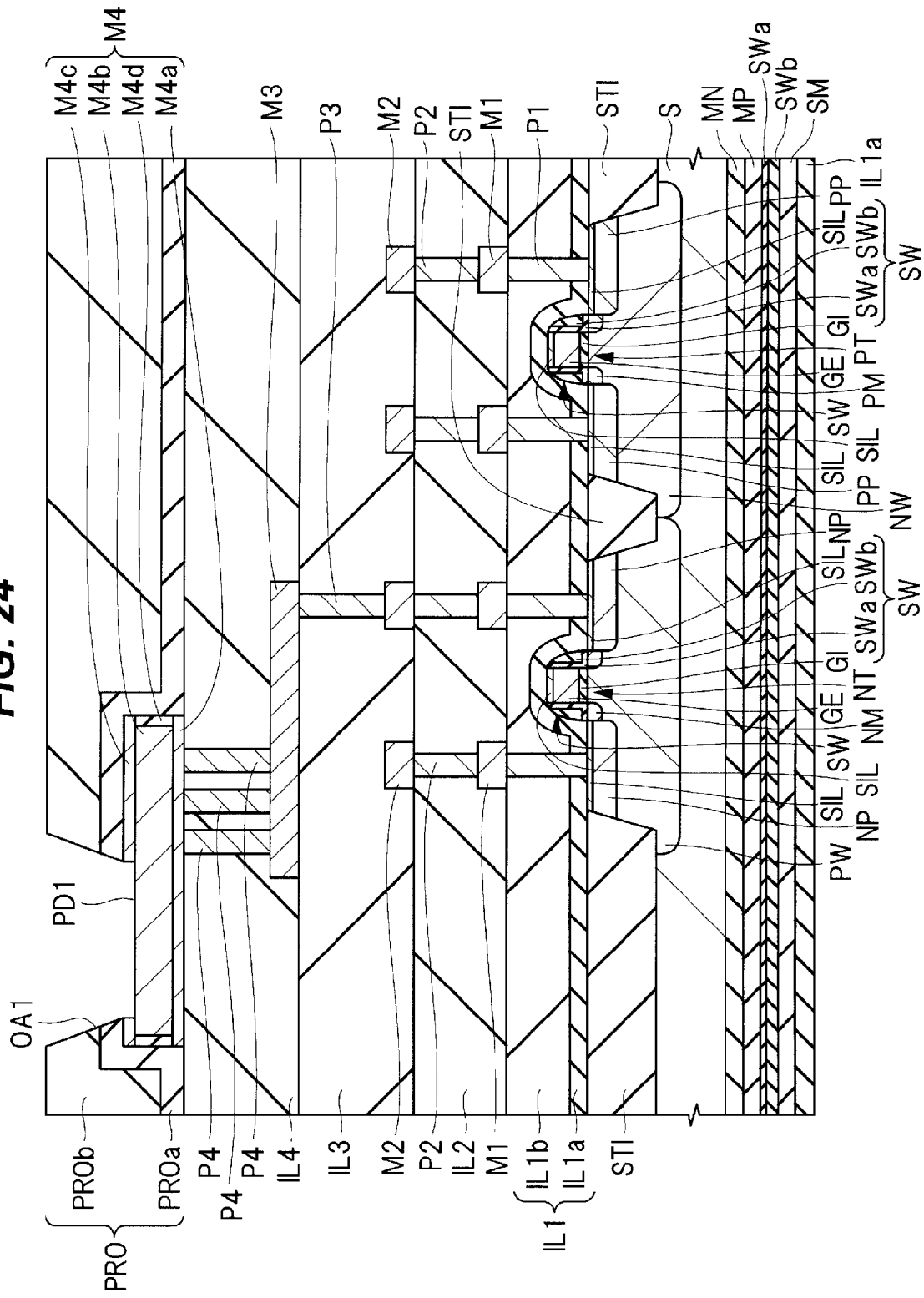
FIG. 24 is a cross-sectional diagram showing a manufacturing step of the semiconductor device of the first embodiment, and is the cross-sectional diagram showing the manufacturing step of the semiconductor device subsequent to FIG. 23.

Next, as shown in FIG. 24, the opening OA1 is formed by removing the protection film PRO over the pad region PD1 of the wiring M4 (aluminum film M4$b$). For example, a photoresist film having an opening in the formation region of the opening OA1 is formed over the protection film PRO, and the protection film PRO is etched by using the photoresist film as a mask. When the anti-reflection film remains, the film is also etched. Next, the exposed titanium film M4$c$ is further etched. As a result, the aluminum film M4$b$ of the pad region PD1 is exposed. In other words, the pad region PD1 of the aluminum film M4$b$ is exposed to the bottom surface of the opening OA1.

Figure 25:
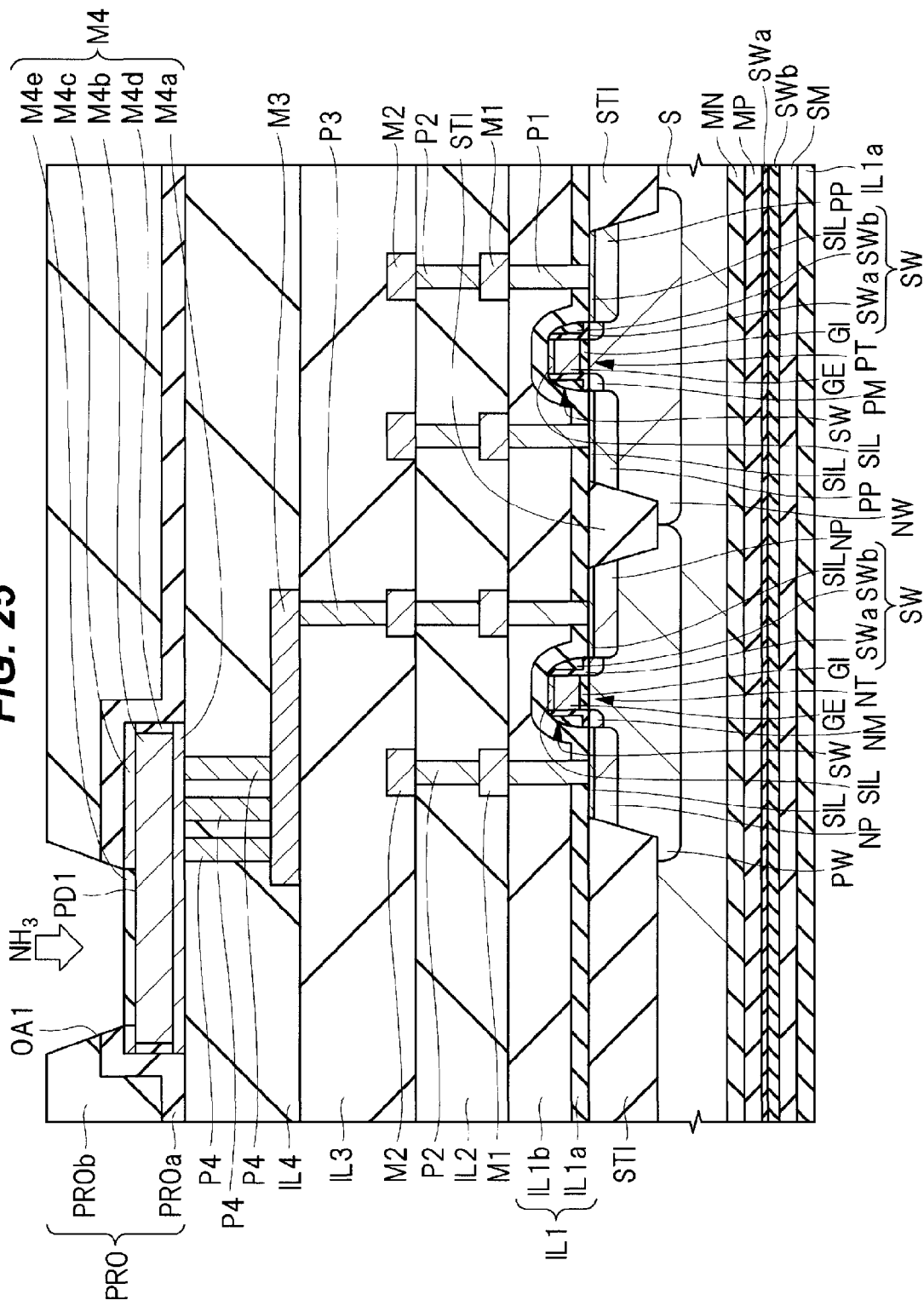
FIG. 25 is a cross-sectional diagram showing a manufacturing step of the semiconductor device of the first embodiment, and is the cross-sectional diagram showing the manufacturing step of the semiconductor device subsequent to FIG. 24.

Next, as shown in FIG. 25, the aluminum nitride film (AlN film) M4$e$ is formed by nitriding the pad region PD1 of the aluminum film M4$b$. For example, ammonia ($NH_3$) plasma treatment is performed. For example, treatment is performed for 20 seconds under a condition of stage temperature: 400° C.; high frequency power: 270 W; pressure inside the treatment chamber: 660 Pa; and $NH_3$ gas flow rate: 145 mL/min (sccm). It is to be noted that in nitriding treatment, plasma treatment using nitrogen compound gas, such as nitrogen ($N_2$) and ammonia ($NH_3$), is performed.

According to such treatment, the aluminum nitride film (AlN film) having a film thickness of approximately 3 to 6 nm can be formed on a surface of the pad region PD1. The film thickness of the aluminum nitride film (AlN film) is preferably set to be less than 10 nm.

Next, utilizing the pad region PD1, performed is a test of whether or not the semiconductor device performs desired operation. For example, a probe needle is stuck into the pad region PD1, a predetermined electrical signal is applied thereto, and performed is test of whether or not the semiconductor device performs desired operation. At this time, since the film thickness of the aluminum nitride film (AlN film) is several nanometers, the aluminum nitride film can be easily broken through by the probe needle, and does not interfere with electrical conduction of the probe needle and the pad region PD1. A probe mark is formed in the pad region PD1 due to this test step.

After that, back grinding of the semiconductor substrate S is performed, the semiconductor substrate S is reduced in film thickness, and is cut (diced) to be divided into a plurality of semiconductor chips (divided into individual pieces). As a result, the semiconductor chip is obtained from each chip region of the semiconductor substrate S (semiconductor wafer).

Figure 26:
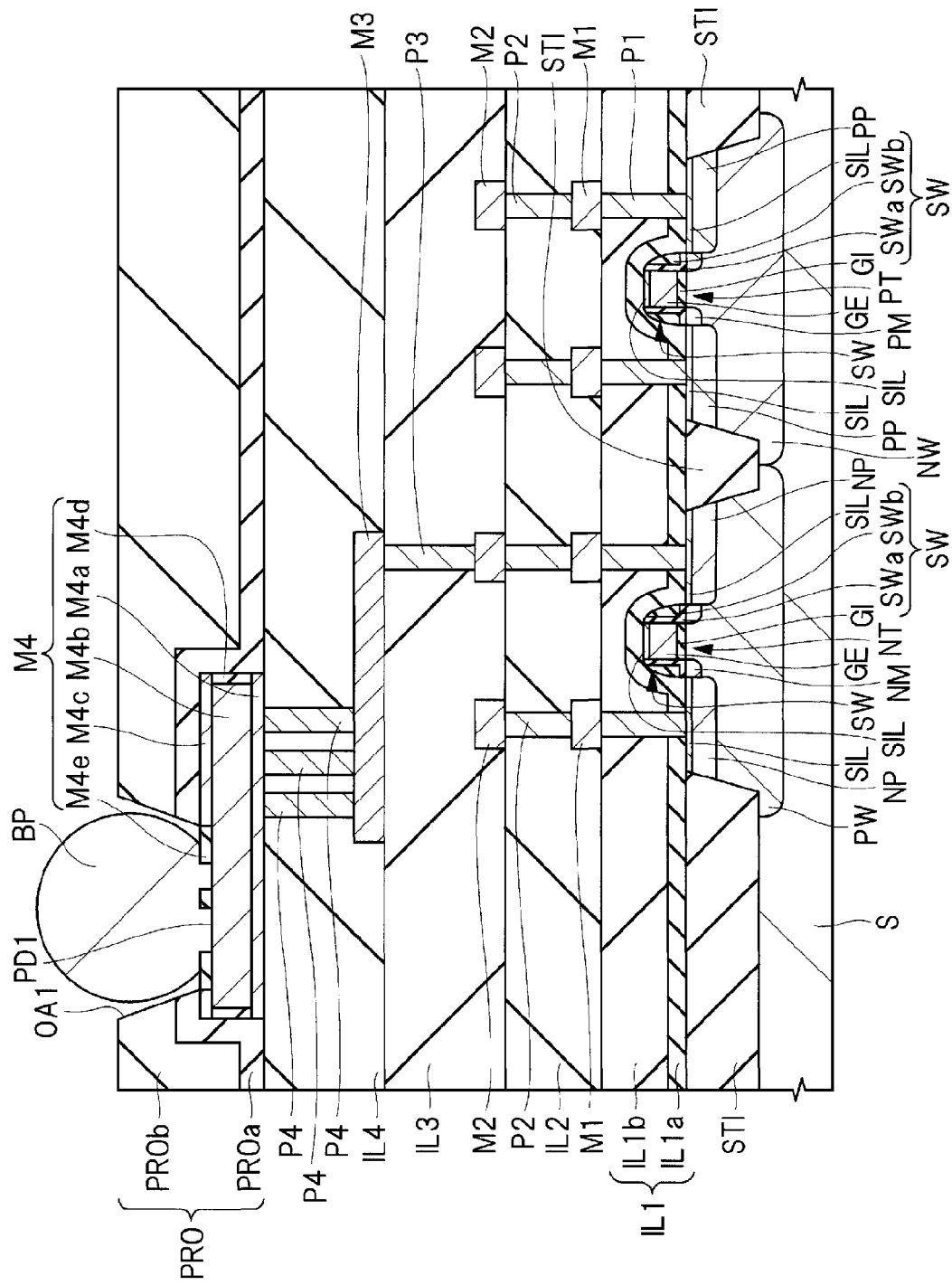
FIG. 26 is a cross-sectional diagram showing a manufacturing step of the semiconductor device of the first embodiment, and is the cross-sectional diagram showing the manufacturing step of the semiconductor device subsequent to FIG. 25.

Next, as shown in FIG. 26, the projection electrode (bump electrode) BP including the conductive member is formed over the pad region PD1 (bonding step). The conductive member, for example, includes gold or an alloy containing gold. For example, a gold ball is formed at a tip of a wire including gold by an electric torch, and the wire connected to the gold ball is cut while crimping the gold ball to the pad region PD1. After this, a gold bump is mounted over an external terminal (a wiring, a lead) formed on a wiring substrate or the like, they are electrically coupled to each other, and thereby the semiconductor device (chip) can be mounted. In addition, electrical coupling of the pad region PD1 and the wiring (lead) may be performed by a bonding wire. In this case, for example, the gold ball is formed at one end of the wire including gold by the electric torch and is crimped to the pad region PD1, and multiple ends of the wire connected to the gold ball are crimped to the wiring (lead).

As described above, the conductive member (the bump electrode, the bonding wire) electrically coupled to the external terminal is fixed over the pad region PD1 by applying pressure, and thereby the aluminum nitride film M4e is cracked (broken), and electrical coupling of the wiring M4 and the conductive member (BP) can be achieved via cracks of the aluminum nitride film M4e.

As explained above in detail, according to the present embodiment, since the aluminum nitride film M4e is provided over the pad region PD1, formation reaction of foreign substances in the pad region PD1 can be prevented also in the case where the silicon nitride film (SWb, IL1a) is formed on the back surface of the semiconductor substrate. Particularly, after the formation step of the pad region PD1, also in a case where time is required by the inspection step and the bonding step, the silicon nitride film is formed on the back surface of the semiconductor substrate, and where a state of the exposure of the pad region PD1 continues for a long period of time, formation reaction of foreign substances can be effectively prevented.

Particularly, since an influence of the film formed on the back surface becomes larger along with enlargement in diameter of the semiconductor substrate (wafer), application of the present embodiment is effective, for example, when a semiconductor substrate (wafer) having a diameter not less than 300 mm is used.

It is to be noted that although in the above-described manufacturing steps, the formation step of the silicon oxide film SWa and the formation step of the silicon nitride film IL1a have been exemplified as the step in which the silicon nitride film is formed on the back surface of the semiconductor substrate, the present invention is not limited to these. A silicon nitride film may be used for another component part of the semiconductor device, and it is needless to say that in a formation step of the silicon nitride film, the silicon nitride film can be formed on the back surface of the semiconductor substrate in some cases. In addition, a silicon nitride film may be used as a mask film formed in various treatment steps (for example, an ion implantation step), it is needless to say that in a formation step of the silicon nitride film, the silicon nitride film can be formed on the back surface of the semiconductor substrate in some cases.

(Application)

Although in the above-described manufacturing steps, nitriding treatment of the pad region PD1 of the aluminum film M4b is performed after the opening OA1 is formed, the nitriding treatment may be performed after passivation treatment (oxidation treatment) is performed on the pad region PD1 of the aluminum film M4b. It is to be noted that since an application is similar to the first embodiment except for the configuration over the pad region PD1 of the aluminum film M4b, detailed explanation thereof is omitted.

Figure 27:
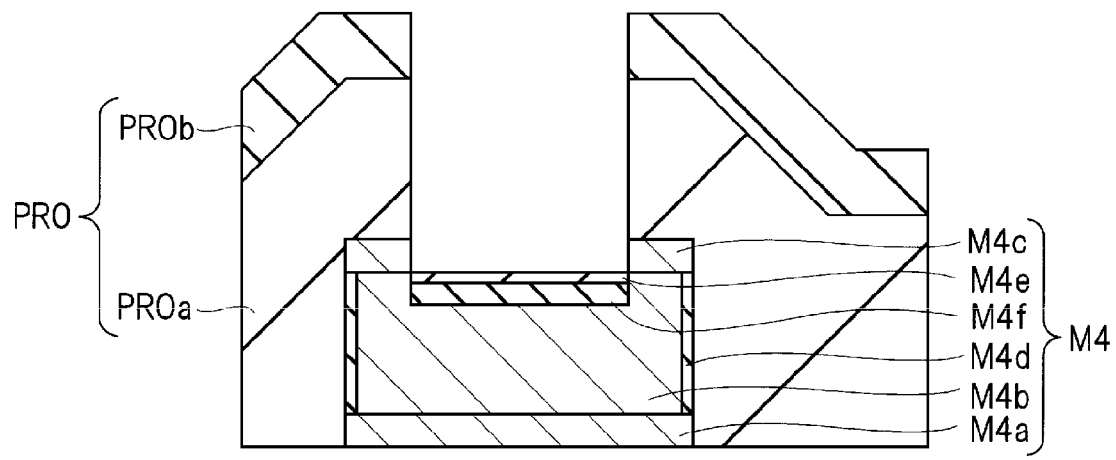
FIG. 27 is a cross-sectional diagram showing a configuration of a pad region of a semiconductor device of an application of the first embodiment.

FIG. 27 is a cross-sectional diagram showing a configuration of a pad region of a semiconductor device of the application of the present embodiment. As shown in FIG. 27, in the present application, the wiring M4 has: the titanium/titanium nitride film M4a; the aluminum film M4b; and the titanium film M4c. The aluminum oxide film ($Al_2O_3$ film) M4d is formed on the side walls of the wiring M4.

In addition, the protection film PRO is formed over the wiring M4, and a stacked film of an aluminum oxide film M4f and the aluminum nitride film M4e is provided in the opening OA1 (pad region PD1) in the protection film PRO. In other words, in the opening OA1 (pad region PD1) in the protection film PRO, the aluminum oxide film M4f is formed over the aluminum film M4b and further, the aluminum nitride film M4e is formed over the aluminum oxide film M4f.

As described above, also when the stacked film of the aluminum oxide film M4f and the aluminum nitride film M4e is provided over the pad region PD1, formation reaction of foreign substances can be prevented in the pad region PD1.

Next, there will be explained a step of forming the stacked film of the aluminum oxide film M4f and the aluminum nitride film M4e over the pad region PD1.

First, as explained with reference to FIG. 24, the opening OA1 is formed by removing the protection film PRO over the pad region PD1 of the wiring M4 (aluminum film M4b) and further, the exposed titanium film M4c is etched. As a result, the aluminum film M4b of the pad region PD1 is exposed.

Next, the aluminum oxide film ($Al_2O_3$ film) M4f is formed by oxidizing the pad region PD1 of the aluminum film M4b (refer to FIG. 27). For example, oxygen plasma treatment is performed for 120 seconds under a condition of stage temperature: 250° C.; high frequency power: 2000 W; pressure inside the treatment chamber: 100 Pa; and $O_2$ gas flow rate: 7000 mL/min (sccm).

Next, the aluminum nitride film (AlN film) is formed by nitriding the pad region PD1 of the aluminum film M4b. For example, $NH_3$ plasma treatment is performed for 20 seconds under a condition of stage temperature: 400° C.; high frequency power: 270 W; pressure inside the treatment chamber: 660 Pa; and $NH_3$ gas flow rate: 145 mL/min (sccm).

In this $NH_3$ plasma treatment, after the aluminum oxide film ($Al_2O_3$ film) M4f is reduced, and the aluminum oxide film is converted into aluminum, an aluminum nitride film can be formed. As a result, the stacked film of the aluminum oxide film M4f and the aluminum nitride film M4f can be formed over the pad region PD1.

It is to be noted that depending on a film thickness of the aluminum oxide film M4f, all of it may become the aluminum nitride film M4e.

Figure 28:
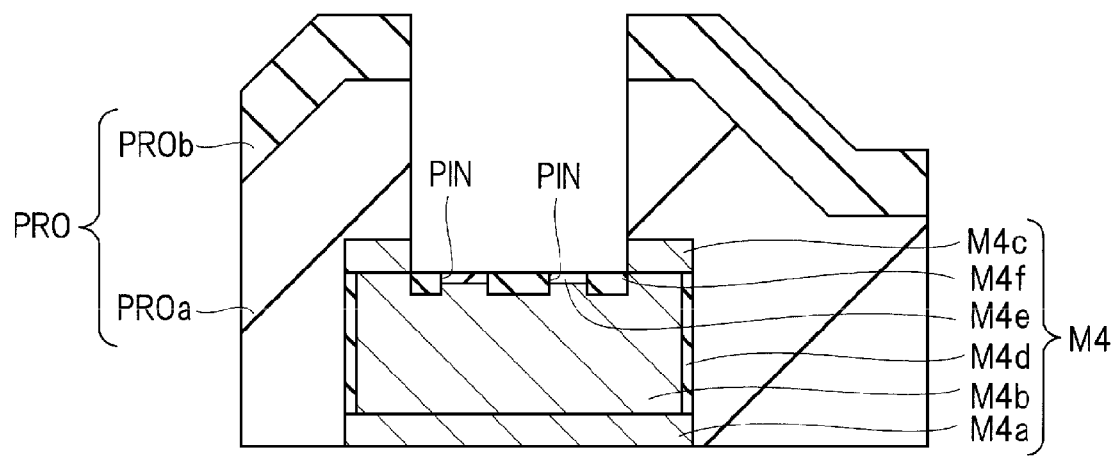
FIG. 28 is a cross-sectional diagram showing another configuration of a stacked film of the pad region.

In addition, the aluminum oxide film M4f is hard to form as a uniform film, and it may be a discontinuous film having pinholes in some cases. FIG. 28 is a cross-sectional diagram showing another configuration of a stacked film of the pad region. As shown in FIG. 28, the aluminum nitride film M4e may be formed so as to fill regions (pinholes) PIN where the aluminum oxide film M4f has not been formed. In this case, for example, N₂ plasma treatment is performed. Since there is no reduction action in the N₂ plasma treatment, the aluminum nitride film M4e is formed in the regions (pinholes) PIN where the aluminum oxide film M4f has not been formed.

In such a case as well, the pad region PD1 is covered with the aluminum oxide film M4f or the aluminum nitride film M4e, and formation reaction of foreign substances can be prevented in the pad region PD1. As a matter of course, $NH_3$ plasma treatment may be performed, and the aluminum nitride film M4e may be formed on the whole pad region PD1 including the regions (pinholes) PIN where the aluminum oxide film M4f has not been formed.

As described above, both of the oxidation treatment and the nitriding treatment may be applied to the pad region PD1. However, since the aluminum oxide film M4f and the aluminum nitride film M4e that are formed are the thin films having thicknesses not more than 5 nm and less than 10 nm, respectively, it is considered that a stacked state of the films can have various modes.

Formation of the films in the stacked states shown in FIGS. 27 and 28 can be confirmed by detecting component elements of the aluminum oxide film M4f and the aluminum nitride film M4e by means of Auger electron spectroscopy analysis and the like.

It is to be noted that since the aluminum oxide film M4f easily becomes the discontinuous film having the pinholes as mentioned above, it is not preferable to cover the pad region PD1 with a single layer of the aluminum oxide film M4f. As shown in FIGS. 27 and 28, formation reaction of foreign substances can be effectively prevented in the pad region PD1 by forming the aluminum nitride film M4e together with the aluminum oxide film M4f.

EXPERIMENTAL EXAMPLE

Figure 29:
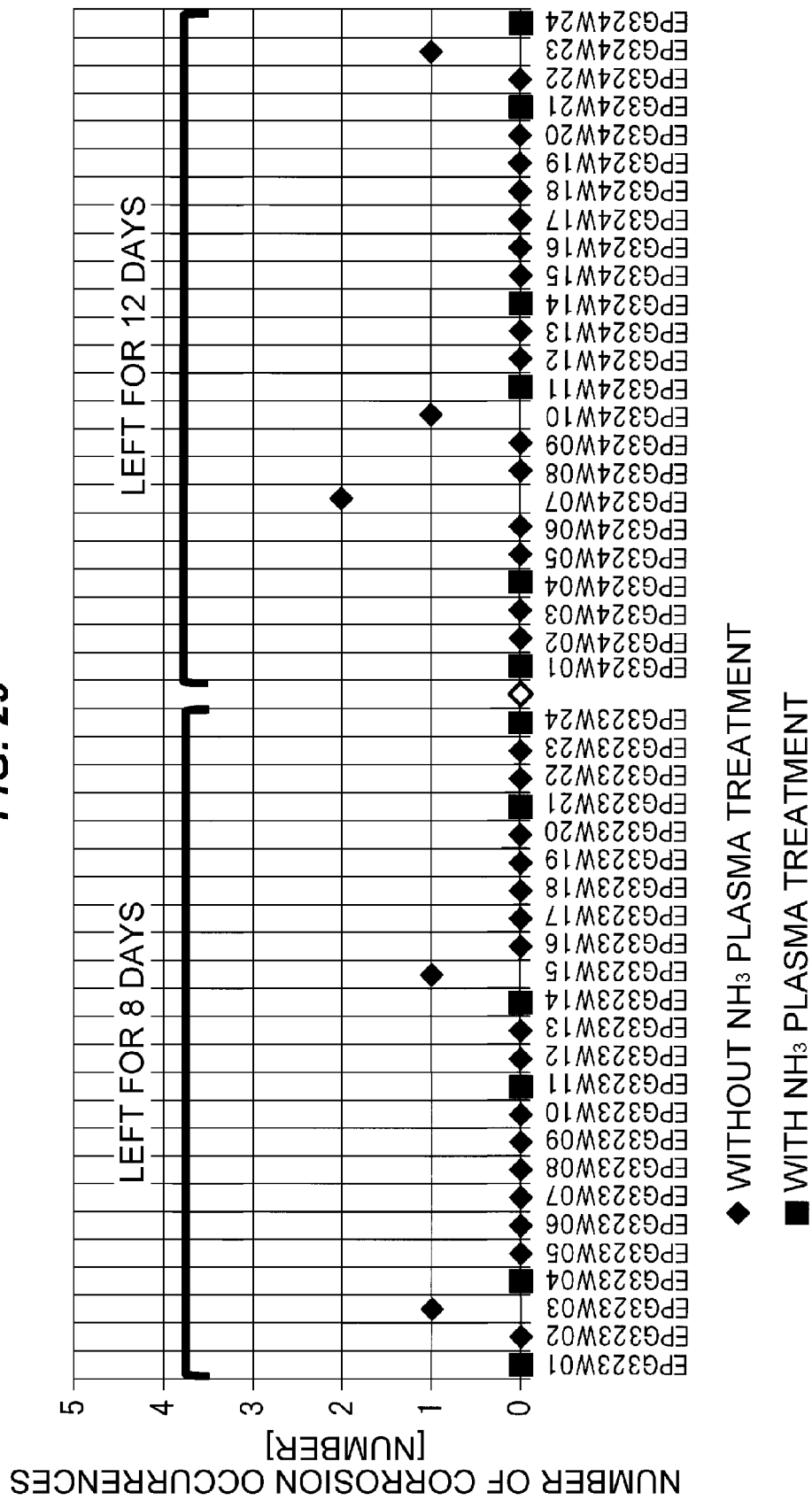
FIG. 29 is a graph showing a relation between presence/absence of $NH_3$ plasma treatment and the number of corrosion occurrences.

FIG. 29 is a graph showing a relation between presence/absence of $NH_3$ plasma treatment and the number of corrosion occurrences. A horizontal axis indicates a wafer number, and a vertical axis indicates the number of corrosion occurrences [number]. Visual inspection test was performed on twenty-four wafers (semiconductor substrates) left (stored) for eight days, and twenty-four wafers (semiconductor substrates) left (stored) for twelve days in a state where silicon nitride films were formed on back surfaces of the semiconductor substrates, and where the pad regions PD1 were exposed.

When $NH_3$ plasma treatment was not performed (rhombus marks), the number of corrosion occurrences increased from two to three as a leaving period becomes longer. Namely, the number of corrosion occurrences increased from two to three as the leaving period became longer. In contrast with this, when $NH_3$ plasma treatment was performed (square marks), the number of corrosion occurrences was zero regardless of the leaving period. Namely, the number of corrosion occurrences in the case where $NH_3$ plasma treatment was performed (square marks) was less than that in the case where $NH_3$ plasma treatment was not performed (rhombus marks), and the number of corrosion occurrences remained less even though the leaving period became longer.

As described above, a preventive effect on corrosion (formation reaction of foreign substances) by the aluminum nitride film M4e over the pad region PD1 could be confirmed.

(Second Embodiment)

Although in the first embodiment, the projection electrode (bump electrode) BP including the conductive member is formed over the pad region PD1 (refer to FIG. 26), a rewiring may be provided over the pad region PD1, and the projection electrode BP including the conductive member may be provided over the rewiring.

Figure 30:
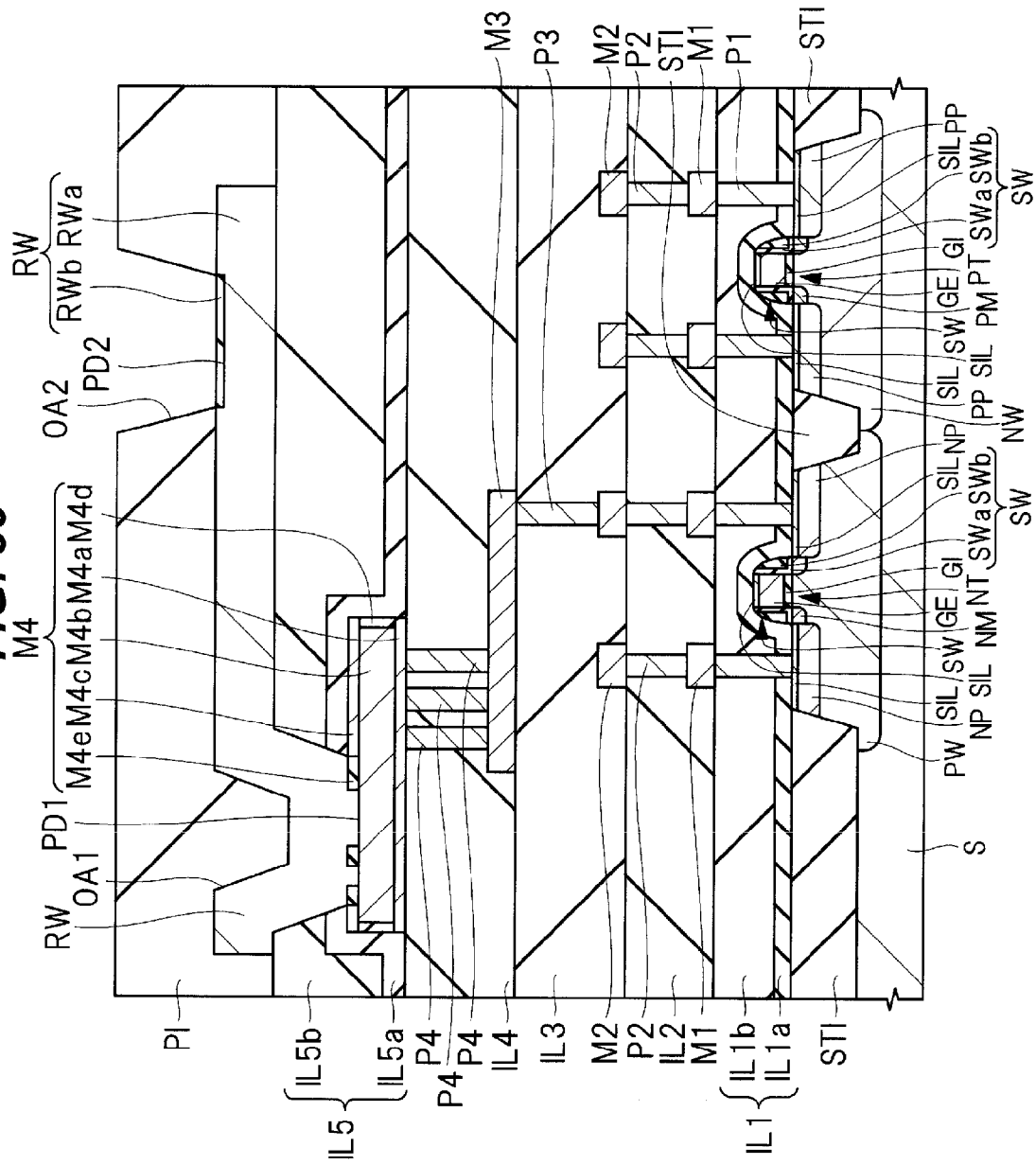
FIG. 30 is a cross-sectional diagram showing a configuration of a semiconductor device of a second embodiment.

FIG. 30 is a cross-sectional diagram showing a configuration of a semiconductor device of the present embodiment. Since configurations of layers lower than the wiring M4 are similar to the case of the first embodiment, detailed explanation thereof is omitted.

As shown in FIG. 30, the wiring M4 is formed over the interlayer insulating film IL4, and is coupled to the wiring M3 via the plugs P4.

An interlayer insulating film IL5 is formed over the wiring M4. The opening OA1 is provided in the interlayer insulating film IL5, and a part of the wiring M4 is exposed from the bottom of the opening OA1. The exposed portion of the wiring M4 is called the pad region PD1. The wiring M4 is the wiring containing aluminum.

A rewiring RW is formed in the opening OA1 and over the interlayer insulating film IL5. Consequently, the wiring M4 and the rewiring RW are coupled to each other at the bottom (pad region PD1) of the opening OA1. The rewiring RW is the wiring containing aluminum.

In the semiconductor device of the present embodiment, the wiring M4 is the top-layer wiring, desired wire connection of a semiconductor element (for example, the above-described MISFET) is made by the wirings (M1 to M4), and desired operation can be performed. Consequently, utilizing the pad region PD1, which is the exposed portion of the wiring (top-layer wiring) M4, can be performed a test (a test step) of whether or not the semiconductor device performs the desired operation.

Additionally, the rewiring RW is the wiring to pull out the pad region PD1, which is a part of the wiring (top-layer wiring) M4, to a desired region (a pad region PD2) of a chip.

A protection film PI is formed over the rewiring RW. An opening OA2 is provided in the protection film PI, and a main surface of the rewiring RW is exposed from a bottom of the opening OA2. The exposed portion of the rewiring RW is called the pad region PD2.

In addition, the projection electrode (bump electrode) BP including the conductive member is formed over the pad region PD2. In addition, a bonding wire including a conductive member may be coupled to over the pad region PD2.

Here, in the present embodiment, the aluminum nitride film M4e is formed on the pad region PD1 (exposed surface) of the wiring (top-layer wiring) M4 containing aluminum, and corrosion of the wiring M4 is prevented. In addition, an aluminum nitride film RWb is formed on the pad region PD2 (an exposed surface) of the rewiring RW containing aluminum, and corrosion of the rewiring RW is prevented.

As described above, also in a case where time is required by the inspection step, the silicon nitride film is formed on the back surface of the semiconductor substrate, and where the state of the exposure of the pad region PD1 continues for a long period of time, formation reaction of foreign substances can be effectively prevented by forming the aluminum nitride film M4e on the pad region PD1. In addition, also in a case where time is required by a subsequent step, such as the bonding step, the silicon nitride film is formed on the back surface of the semiconductor substrate, and where a state of the exposure of the pad region PD2 continues for a long period of time, formation reaction of foreign substances can be effectively prevented by forming the aluminum nitride film RWb on the pad region PD2.

Next, formation steps of the wiring M4 and the rewiring RW will be explained.

First, the interlayer insulating film IL5 is formed over the wiring M4. For example, similarly to the case of the first embodiment, a silicon nitride film IL5a is deposited over the interlayer insulating film IL4 including the top of the wiring M4 by the CVD method or the like and further, a silicon oxide film IL5b is deposited over the silicon nitride film IL5a by the CVD method or the like (refer to FIG. 23).

Next, the opening OA1 is formed by removing the interlayer insulating film IL5 over the pad region PD1 of the wiring M4 (aluminum film M4b). For example, a photoresist film having an opening in the formation region of the opening OA1 is formed over the interlayer insulating film IL5, and the interlayer insulating film IL5 is etched by using the photoresist film as a mask. Next, the exposed titanium film M4c is further etched. As a result, the aluminum film M4b of the pad region PD1 is exposed (refer to FIG. 24).

Next, an aluminum nitride film (AlN film) is formed by nitriding the pad region PD1 of the aluminum film M4b (refer to FIG. 25). For example, similarly to the case of the first embodiment, ammonia (NH$_3$) plasma treatment is performed.

Next, utilizing the pad region PD1, performed is a test of whether or not the semiconductor device performs desired operation. For example, a probe needle is stuck into the pad region PD1, and conduction test is performed. At this time, since a film thickness of the aluminum nitride film (AlN film) is several nanometers, the aluminum nitride film can be easily broken through by the probe needle, and does not interfere with the conduction test.

Next, the rewiring RW including the conductive film is formed in the opening OA1 and over the interlayer insulating film IL5. For example, an aluminum film is deposited in the opening OA1 and over the interlayer insulating film IL5 as a conductive film using the sputtering method or the like. A stacked film including a titanium/titanium nitride film, an aluminum film, and a titanium nitride film may be used as the conductive film. Next, the rewiring RW is formed by patterning the above-described conductive film using the photolithography technology and the etching technology.

Next, the protection film PI is formed over the rewiring RW. For example, a photosensitive polyimide film is used as the protection film PI, and it is coated over the rewiring RW and the interlayer insulating film IL5.

Next, the opening OA2 is formed by removing the protection film PI over the pad region PD2 of the rewiring RW (aluminum film RWa). For example, the opening OA2 is formed by exposing and developing the photosensitive polyimide film. As a result, the rewiring (aluminum film) RW of the pad region PD2 is exposed. It is to be noted that when the stacked film including the titanium/titanium nitride film, the aluminum film, and the titanium nitride film is used as the rewiring RW, the titanium nitride film of the pad region PD2 is also removed, and the aluminum film is exposed.

Next, an aluminum nitride film (AlN film) is formed by nitriding the pad region PD2 of the rewiring (aluminum film) RW. For example, similarly to the case of the first embodiment, ammonia (NH$_3$) plasma treatment is performed.

After that, back grinding of the semiconductor substrate S is performed, the semiconductor substrate S is reduced in film thickness, and is cut (diced) to be divided into a plurality of semiconductor chips (divided into individual pieces). As a result, a semiconductor chip is obtained from each chip region of the semiconductor substrate S (semiconductor wafer).

Next, the projection electrode (bump electrode) BP including the conductive member is formed over the pad region PD2 (bonding step). The projection electrode (bump electrode) BP can be formed similarly to the first embodiment. In addition, a bonding wire may be formed over the pad region PD2 similarly to the first embodiment.

It is to be noted that since the aluminum nitride film (AlN film) over the pad region PD1 of the wiring M4 is easily cracked (broken) by a film stress at the time of formation of the rewiring RW, electrical conduction of the wiring M4 and the rewiring RW can be achieved. In addition, when a connection resistance between the wiring M4 and the rewiring RW is high, the aluminum nitride film (AlN film) over the pad region PD1 of the wiring M4 may be removed before the formation step of the rewiring RW.

Hereinbefore, although the invention made by the present inventor has been specifically explained based on the embodiments, the present invention is not limited to the above-described embodiments, and it is needless to say that various changes can be made without departing from the scope of the invention.

For example, although the wirings M1 to M3 are formed by patterning in the first embodiment, they may be formed using a so-called "damascene method" in which a conductive film, such as copper (Cu), is buried in a wiring groove provided in an interlayer insulating film. In addition, the wirings and the plugs (such as M2 and P2) may be formed using a so-called "dual damascene method" in which the conductive film, such as copper (Cu), is simultaneously buried in the wiring groove in the interlayer insulating film and a contact hole thereunder.

What is claimed is:

1. A method of manufacturing a semiconductor device, comprising:
    forming a silicon nitride film above a surface of a semiconductor substrate;
    forming a first wiring above the silicon nitride film;
    forming a first insulating film over the first wiring;
    forming a second wiring containing aluminum over the first wiring via the first insulating film;
    forming a second insulating film over the second wiring;
    forming an opening that exposes a part of the second wiring by removing the second insulating film over the second wiring; and
    after the forming of the opening, forming aluminum nitride on a surface of the exposed second wiring,
    wherein the forming of the silicon nitride film comprises forming the silicon nitride film on a back surface of the semiconductor substrate,
    wherein the forming of the second wiring comprises forming the second wiring by etching a conductive film containing aluminum, and
    wherein the method further comprises:
        after the forming of the second wiring and before the forming of the second insulating film, forming aluminum oxide on side walls of the second wiring.

2. The method of manufacturing a semiconductor device according to claim 1, wherein the forming of the silicon nitride film comprises forming the silicon nitride film by chemical vapor deposition in a state where an outer periphery of the semiconductor substrate is held and at least a part of the back surface of the semiconductor substrate is exposed.

3. The method of manufacturing a semiconductor device according to claim 2, wherein the forming of the silicon nitride film comprises forming the silicon nitride film with respect to each of a plurality of the semiconductor substrates in a same treatment apparatus.

4. The method of manufacturing a semiconductor device according to claim 1, wherein the forming of the aluminum nitride comprises a plasma treatment of a nitrogen compound.

5. The method of manufacturing a semiconductor device according to claim 4, wherein the nitrogen compound comprises $NH_3$.

6. The method of manufacturing a semiconductor device according to claim 1, further comprising:
after the forming of the aluminum nitride, forming a conductive member on an exposed surface of the second wiring including a top of the aluminum nitride to achieve electric connection between the second wiring and the conductive member.

7. The method of manufacturing a semiconductor device according to claim 6, further comprising:
after the forming of the aluminum nitride and before the forming of the conductive member, storing the semiconductor device in a storage container.

8. The method of manufacturing a semiconductor device according to claim 6, wherein the conductive member comprises a bonding wire or a bump electrode.

9. The method of manufacturing a semiconductor device according to claim 7, further comprising,
after the forming of the aluminum nitride and before the forming of the conductive member, applying an electrical signal to the exposed surface of the second wiring including the top of the aluminum nitride.

10. The method of manufacturing a semiconductor device according to claim 1, wherein the forming of the silicon nitride film comprises forming a side wall insulating film having the silicon nitride film on both sides of a gate electrode of an MISFET.

11. The method of manufacturing a semiconductor device according to claim 1, wherein the forming of the silicon nitride film comprises covering an upper part of an MISFET with a stacked film of the silicon nitride film and a silicon oxide film located at an upper part of the silicon nitride film.

12. The method of manufacturing a semiconductor device according to claim 1, wherein the forming of the second wiring comprises:
forming a stacked film comprising:
forming a titanium/titanium nitride film on the first insulating film;
forming an aluminum film comprising the aluminum, on the titanium/titanium nitride film; and
forming a titanium film on the aluminum film; and
patterning the stacked film.

13. A method of manufacturing a semiconductor device, comprising:
forming a silicon nitride film above a surface of a semiconductor substrate;
forming a first wiring above the silicon nitride film;
forming a first insulating film over the first wiring;
forming a second wiring containing aluminum over the first wiring via the first insulating film;
forming a second insulating film over the second wiring;
forming an opening that exposes a part of the second wiring by removing the second insulating film over the second wiring; and
after the forming of the opening, forming aluminum nitride on a surface of the exposed second wiring,
wherein the forming of the silicon nitride film comprises forming the silicon nitride film on a back surface of the semiconductor substrate,
wherein the forming of the second wiring comprises:
forming a stacked film comprising:
forming a titanium/titanium nitride film on the first insulating film;
forming an aluminum film comprising the aluminum, on the titanium/titanium nitride film; and
forming a titanium film on the aluminum film; and
patterning the stacked film, and
wherein the forming of the second wiring further comprises:
performing an oxygen plasma treatment on a side surface of the aluminum film to form an aluminum oxide film on a side surface of the aluminum film.

14. The method of manufacturing a semiconductor device according to claim 13, wherein the forming of the opening comprises exposing a portion of the titanium film.

15. The method of manufacturing a semiconductor device according to claim 14, further comprising:
etching the exposed portion of the titanium film to expose a surface of the aluminum film,
wherein the forming of the aluminum nitride comprises nitriding the exposed surface of the aluminum film.

16. The method of manufacturing a semiconductor device according to claim 15, wherein the nitriding of the exposed surface of the aluminum film comprises performing an ammonia ($NH_3$) plasma treatment of the exposed surface of the aluminum film.

* * * * *